United States Patent [19]
Alexandres et al.

[11] Patent Number: 5,315,253
[45] Date of Patent: May 24, 1994

[54] METHOD AND APPARATUS FOR MEASURING THE VOLTAGE AND CHARGE OF A BATTERY

[75] Inventors: Richard B. Alexandres, Clear Lake; Dennis P. Kindschuh, Mason City, both of Iowa; Larry Hall, Kansas City, Mo.; Perry B. Peden, Lenexa, Kans.; Larry Klusman, Lenexa, Kans.; Steve Potratz, Lenexa, Kans.

[73] Assignee: Alexander Manufacturing Company, Mason City, Iowa

[21] Appl. No.: 937,223

[22] Filed: Aug. 28, 1992

Related U.S. Application Data

[63] Continuation of Ser. No. 355,679, May 22, 1989, Pat. No. 5,144,248.

[51] Int. Cl.⁵ .................. G01N 27/416; H02J 7/04
[52] U.S. Cl. .................................. 324/429; 324/428; 324/433; 320/48
[58] Field of Search ............. 324/426, 427, 435, 437, 324/428, 429, 433; 340/636; 320/48, 37, 38

[56] References Cited

U.S. PATENT DOCUMENTS 4,390,841 6/1983 Martin et al. ............... 324/427
4,678,998 7/1987 Muramatsu ................. 324/427

Primary Examiner—Kenneth A. Wieber
Assistant Examiner—Maura K. Regan
Attorney, Agent, or Firm—Hugh D. Jaeger

[57] ABSTRACT

Method and apparatus for measuring the voltage and state of charge of a secondary battery. The voltage and state of charge values are taken by a circuit every four (4) seconds by reading voltage, waiting two (2) seconds, reading current, waiting two (2) seconds, and repeating the voltage readings and the current readings. The circuit includes a 4-bit microprocessor, CMOS analog switches, and two operational amplifiers. The voltage and current readings are taken from dual-sloped converters, and the values determined by software algorithms in the microprocessor.

24 Claims, 16 Drawing Sheets

METHOD AND APPARATUS FOR MEASURING THE VOLTAGE AND CHARGE OF A BATTERY

This application is a continuation of U.S. Ser. No. 07/355,679, filed May 22, 1989, entitled "Method and Apparatus for Measuring the Voltage and Charge of a Battery" to the same assignee, now U.S. Pat. No. 5,144,84.

BACKGROUND OF THE INVENTION

1. Field of the Invention

The present invention pertains to a system for reading the voltage and state of charge of a battery. This system can be built into the battery including an LCD display, can be connected to the battery, or connected between a battery and a charging system.

2. Description of the Prior Art

Prior art systems have read battery voltage, but have not accurately measured current consumed or current added to a battery, and displayed this particular measurement.

Present day secondary batteries, such as Video Tape Recorder (VTR) batteries, need an accurate display of voltage, as well as current consumed, so that a battery is not run down to below recommended voltage or current during a video operation.

There is a need in secondary batteries to have a concise display indicating voltage of the battery, as well as current consumed or current added. There is a further need to indicate when a secondary battery is fully charged, is discharged, is being recharged, or is going through an automatic recharge cycle.

The prior art has been lacking in systems to indicate the state of a battery, and especially any systems which are built into the battery itself.

The present invention overcomes the disadvantages of the prior art by providing a system to read the voltage of a battery and the degree of discharge of the battery.

SUMMARY OF THE INVENTION

The general purpose of the present invention is to provide a system designed to read the voltage and status of charge of a battery. Voltage and current readings are taken every four (4) seconds when the voltage is read, two (2) seconds elapses, the current is read, two (2) seconds elapses, the voltage is read, and the steps are repeated by way of example and for purposes of illustration only and not to be construed as limiting of the present invention. The voltage readings on the display are an average of the last sixteen (16) seconds. This reduces the rounding errors of the readings and increases the apparent resolution. The electronics can read battery voltages from 4.8 to 19.9 volts by way of example and for purposes of illustration only and not to be construed as limiting. The current readings are integrated for display to show the amount of current consumed from the battery. The maximum reading that can be displayed is 9.999 Amp/hr. At that point, the system in this example rolls over and starts counting from zero again. An LCD shows how much more current is needed to bring the battery up to a full charge. When the battery is fully charged, a short pulse is outputted from the microcomputer to switch the charger into a trickle charge mode to protect against over charging. A self-calibration is performed when the unit is reset and every minute thereafter. This allows the unit to be manufactured without any adjustment pots or selected components which significantly reduces production time and overall cost.

The system has several options which can be enabled. The unit may display only voltage, current or charge status at each sample. These modes also allow the electronics to be easily tested in the manufacturing process.

The system is designed to be a low-cost, accurate measuring device. The absolute accuracy depends on the exact input voltage to each of the dual-sloped converters. The algorithms are executed by a 4-bit processor which performs the measurements at four (4) second intervals for the voltage and current. Therefore, a voltage or current conversion and the calculations associated with the conversions are performed every two (2) seconds. The accuracy integrated over time for current is excellent and the apparent accuracy for voltage is increased by averaging the previous four (4) readings in the software.

According to one embodiment of the present invention, there is provided a system for reading the voltage of a battery and the current consumed or added to the battery including a battery, a load across the battery, a voltage conditioner connected to the positive pole of the battery, a current conditioner connected to the negative pole of the battery, a microprocessor connected to the voltage conditioner and the current conditioner, and an LCD display connected to the microprocessor. Voltage and current readings are taken every four (4) seconds by way of example and for purposes of illustration only and not to be construed as limiting of the present invention. This information is processed by algorithms in a microprocessor and subsequently displayed on an LCD display. The microprocessor and the display can be incorporated directly within the battery housing, can be mounted on the battery or can be mounted separate from the battery.

Significant aspects and features of the present invention include a system with an LCD display which can be incorporated into a battery housing for indication of the voltage of a battery and the current consumed or added to the battery. This is especially beneficial for larger batteries, such as for video television recorders (VTR) and other batteries which require the additional monitoring hardware.

Another significant aspect and feature of the present invention is incorporating the system and the display into NiCad battery chargers for indicating the voltage of a battery, as well as the charge consumed or added to the battery. The system can also, on sensing a fully charged battery, switch a charger from a charge mode into a trickle charge mode, as a protection feature.

A further significant aspect and feature of the present invention is a display which indicates the condition of the battery, whether the battery is in a discharge mode, a charge mode, a ready mode, an automatic charging cycle mode, or is being recharged. The display visually indicates to a user the condition of the battery in numerics as to the voltage and charge, and also shows the state of the battery.

Having thus described the embodiments of the present invention, it is a principal object hereof to provide a system for reading the voltage and charge status of a battery.

One object of the present invention is a system including a voltage conditioner, a current conditioner, a load microprocessor, and an LCD display which can be incorporated into a battery.

Another object of the present invention is a system which can be utilized with a battery charger, such as for NiCad batteries.

A further object of the present invention is a system which can be used with any type of batteries such as lead-acid cells, gel cells, etc.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIGS. 9A-9D are assembled.

DESCRIPTION OF THE PREFERRED EMBODIMENTS

Figure 1:
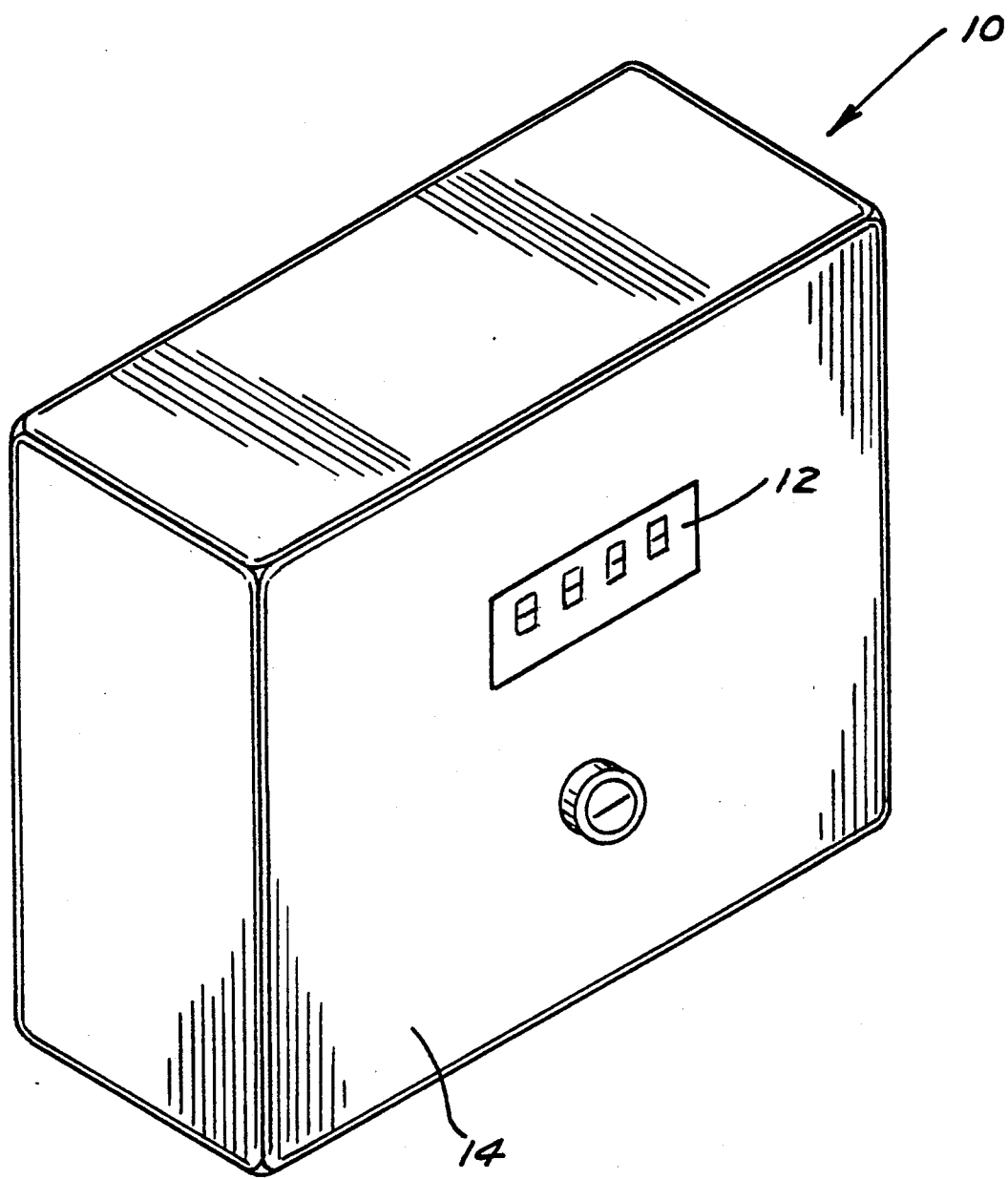
FIG. 1 illustrates a perspective view of a video television recorder battery incorporating a system for reading the voltage and charge status of the battery.

FIG. 1 illustrates a perspective view of a battery system 10 for reading the voltage and charge status of a battery, including an LCD display 12 in a video television recorder (VTR) battery 14. By mounting the monitor directly in the battery 14, it can be used as a manufacturing aid and is always available to show status throughout the battery life. LCD display 12 should be positioned for ease of visual access whenever the battery is coupled to a charger, coupled to the video television recorder in operation, or uncoupled as in transit and storage.

Figure 2:
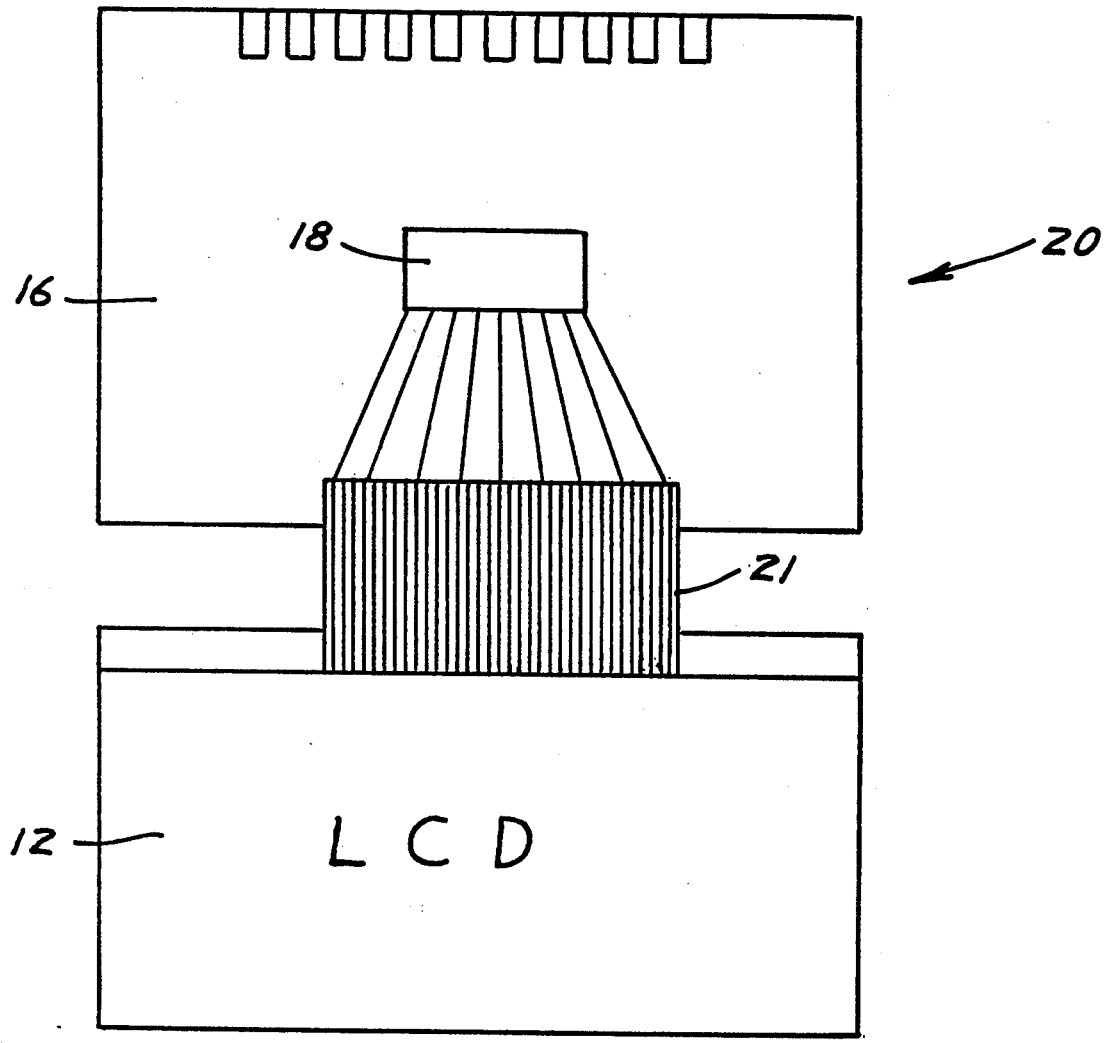
FIG. 2 illustrates a three-semiconductor system for implementing the present invention.

FIG. 2 illustrates a plan view of the system 10, including the LCD display 12 and a circuit board 16 with a microprocessor 18 thereon. A flexible cable 21 connects the LCD display 12 to the circuit board 16. This convenient three substrate system is the preferred mode of the subject invention. It permits great flexibility in placement of the elements. As stated above, LCD display 12 should be placed for easy viewing during operation, charging, storage and transit. Circuit board 16, on the other hand may be placed in any available space including being imbedded out of sight of the operator.

Figure 3:
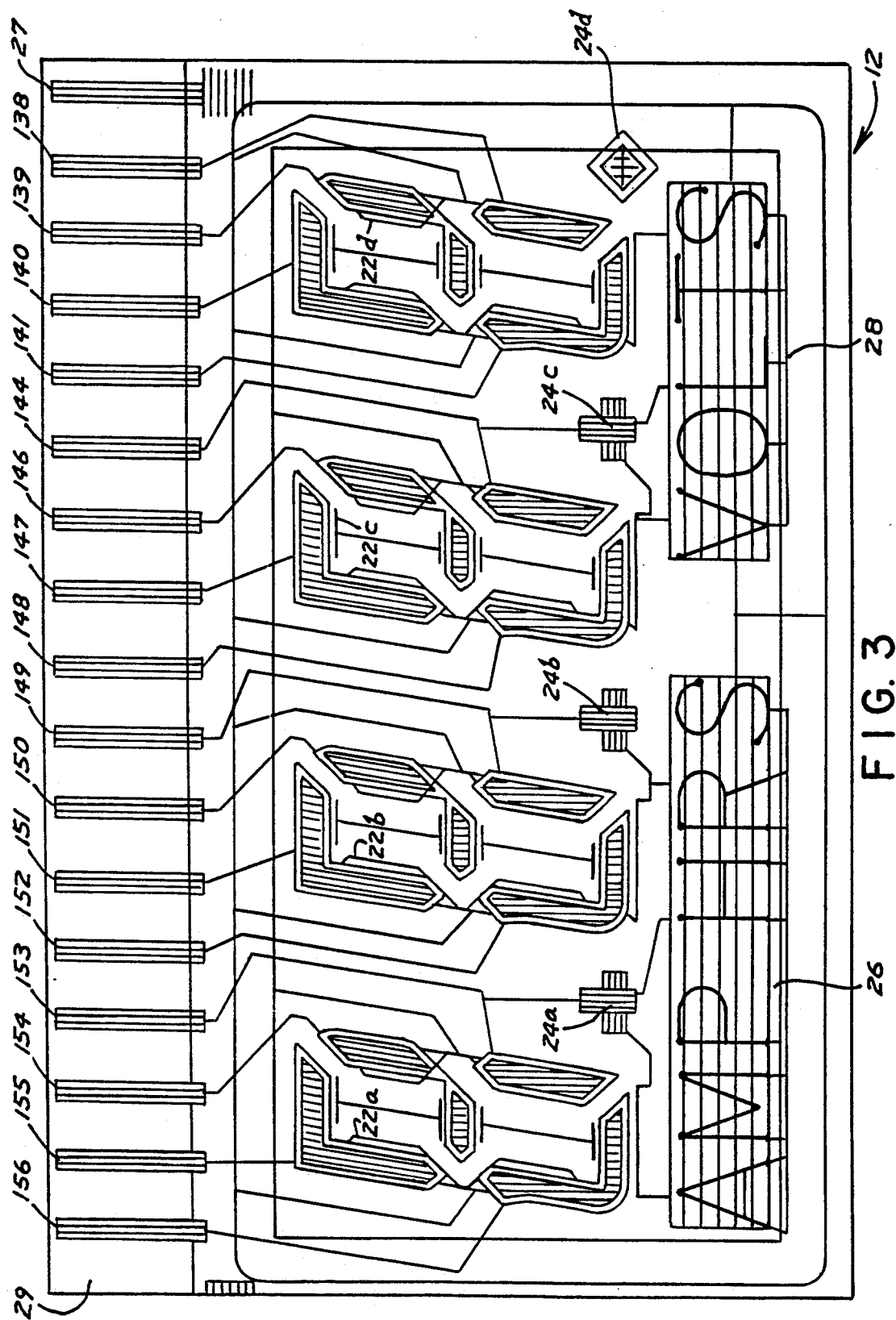
FIG. 3 illustrates a view of the display for a battery monitor incorporated into the battery.

FIG. 3 illustrates a plan view of the LCD display 12 for mounting directly on battery 14. Display 12 includes four digits 22a-22d, a floating decimal point 24a-24n, display verbiage for amp hours 26 and display verbiage for volts 2. LCD display 12 is preferably Model DCI 1067. Connector 29 couples directly to flexible cable 21 (see also FIG. 2), whereby the various elements of LCD display 12 are energized.

Figure 8A:
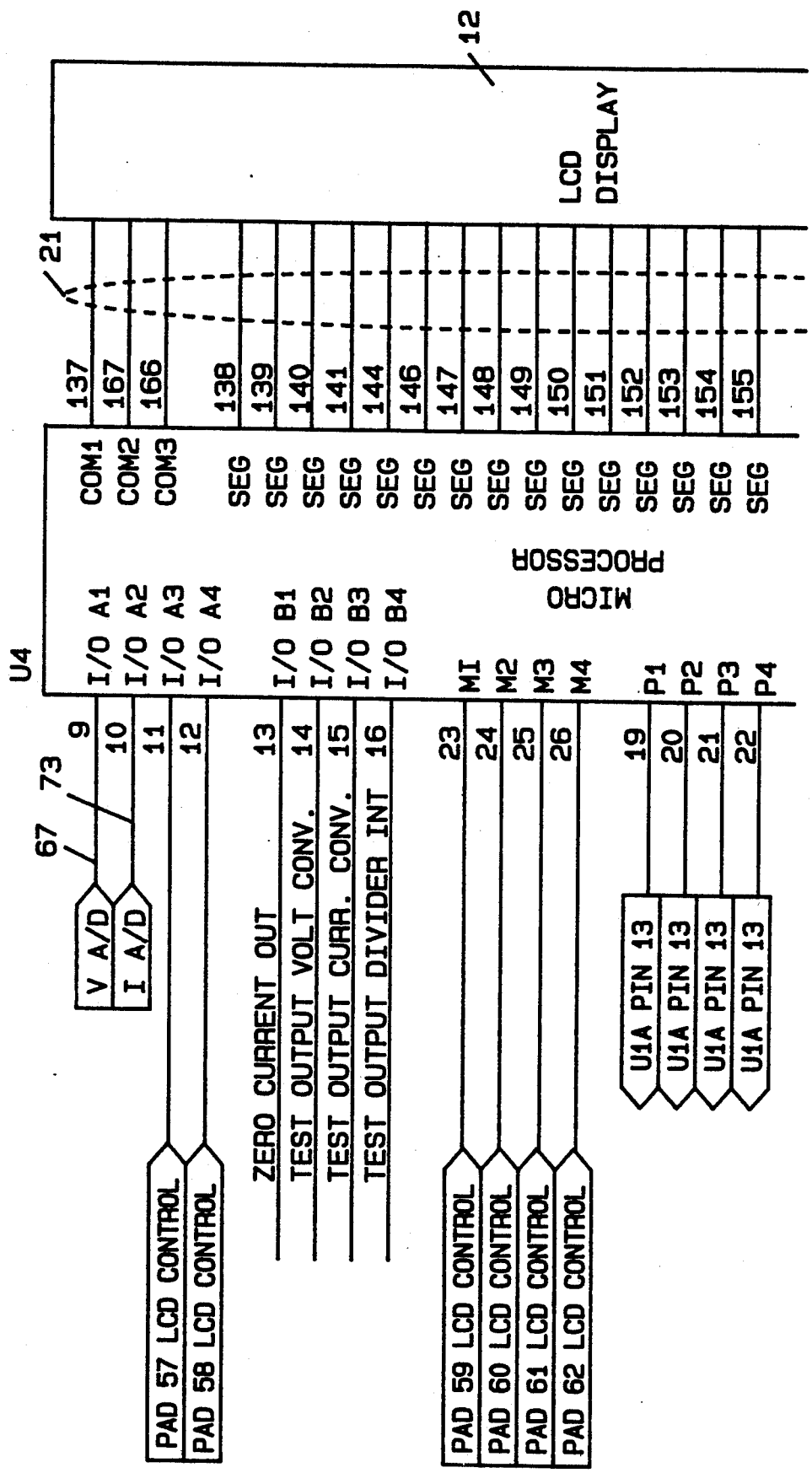
FIG. 8A and 8B illustrate the electrical circuit connections to the microprocessor.
Figure 8B:
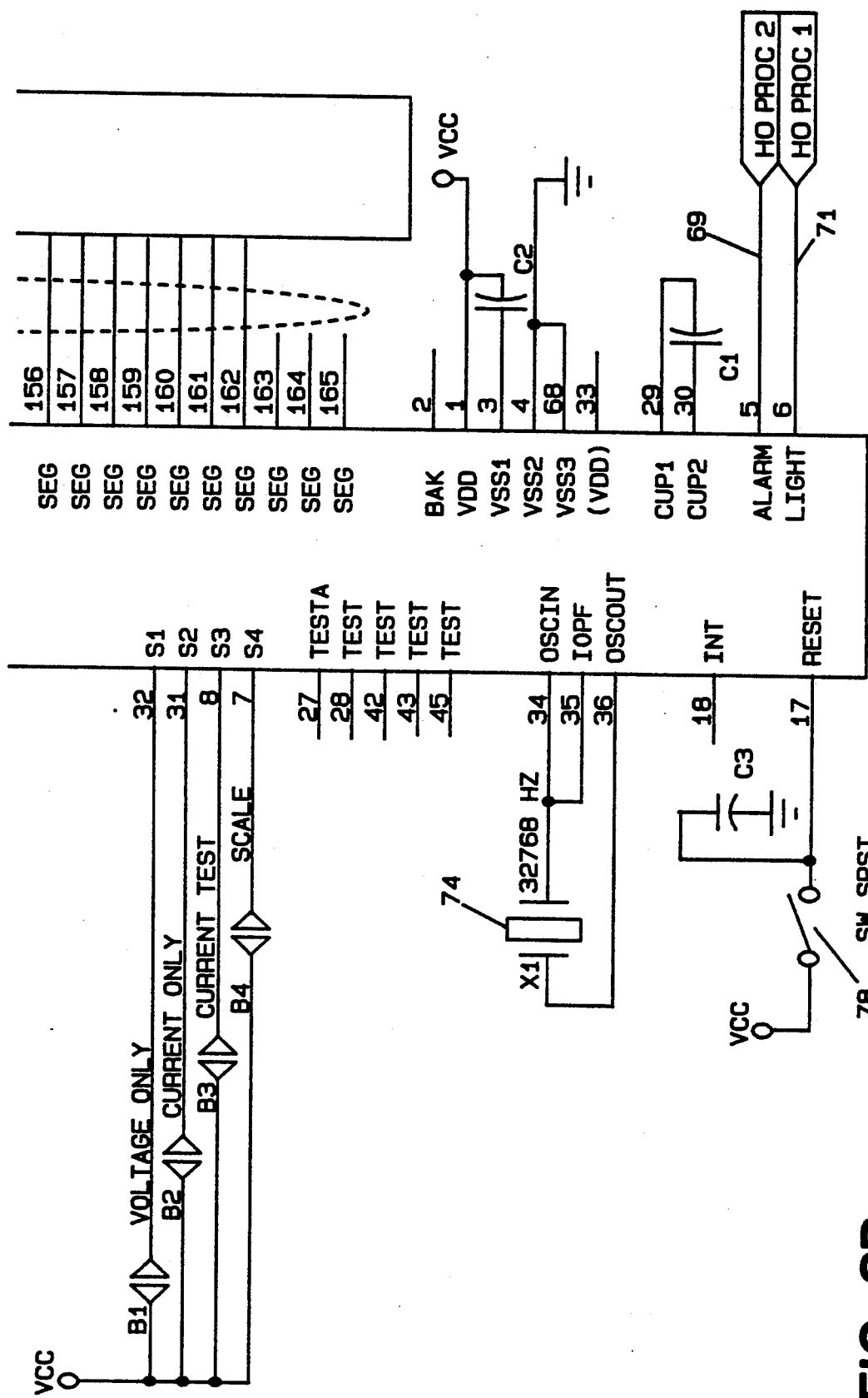
Figure 9A:
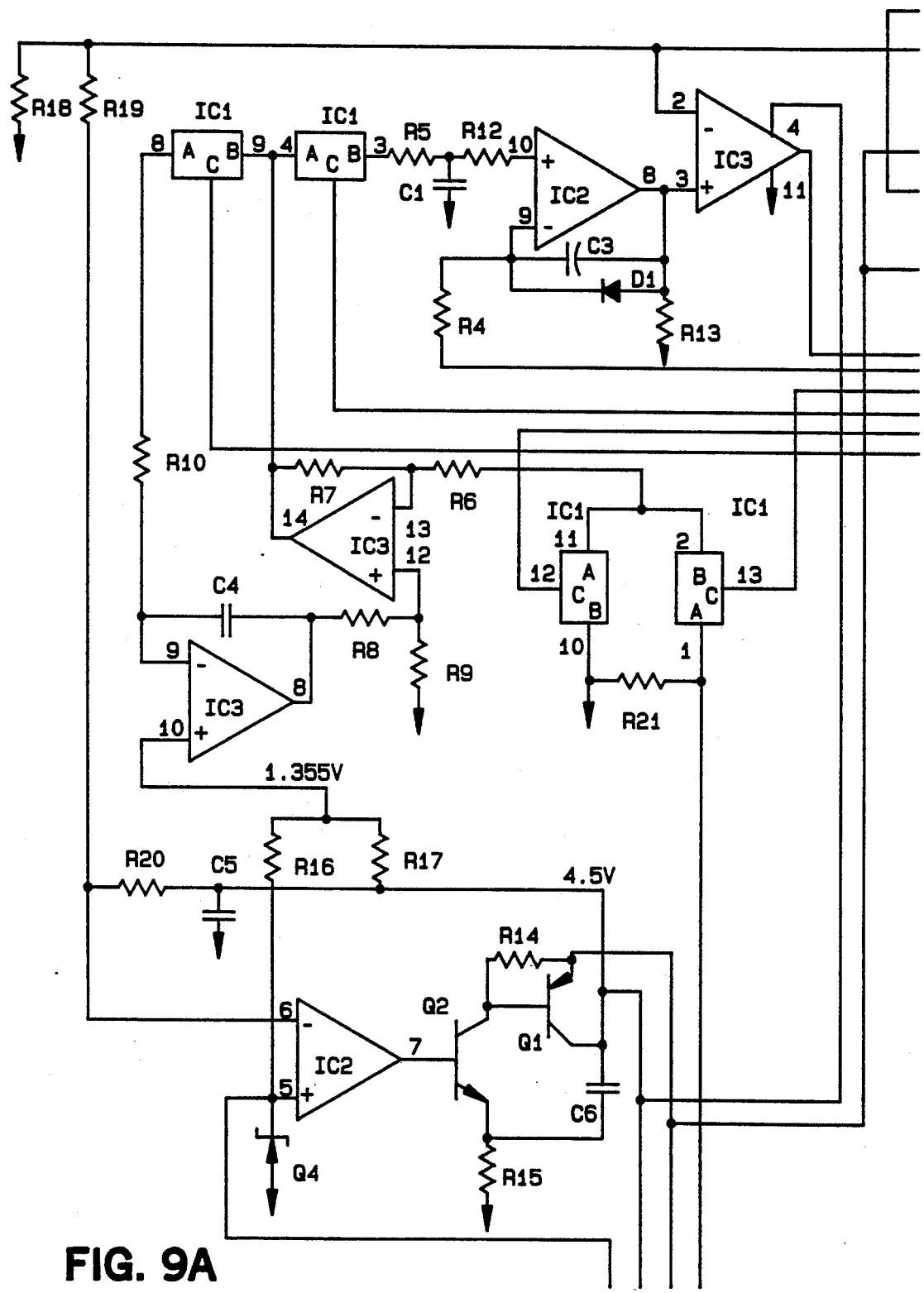
FIGS. 9A-9D illustrate an alternative embodiment to the circuits of FIGS. 7 and 8; and, FIGS. 10A and 10B illustrate a flow chart for operation of the present invention.
Figure 9B:
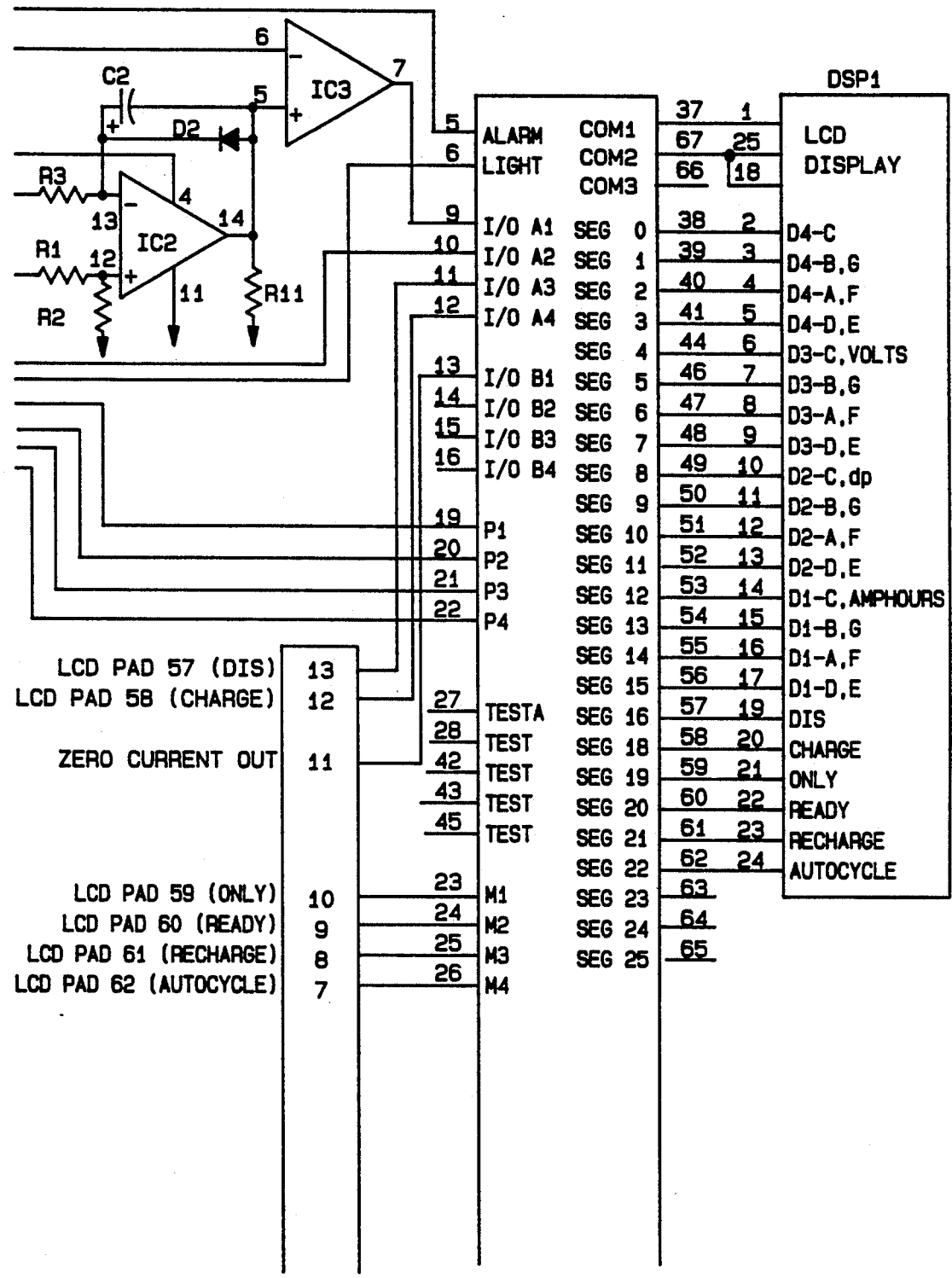
Figure 9C:
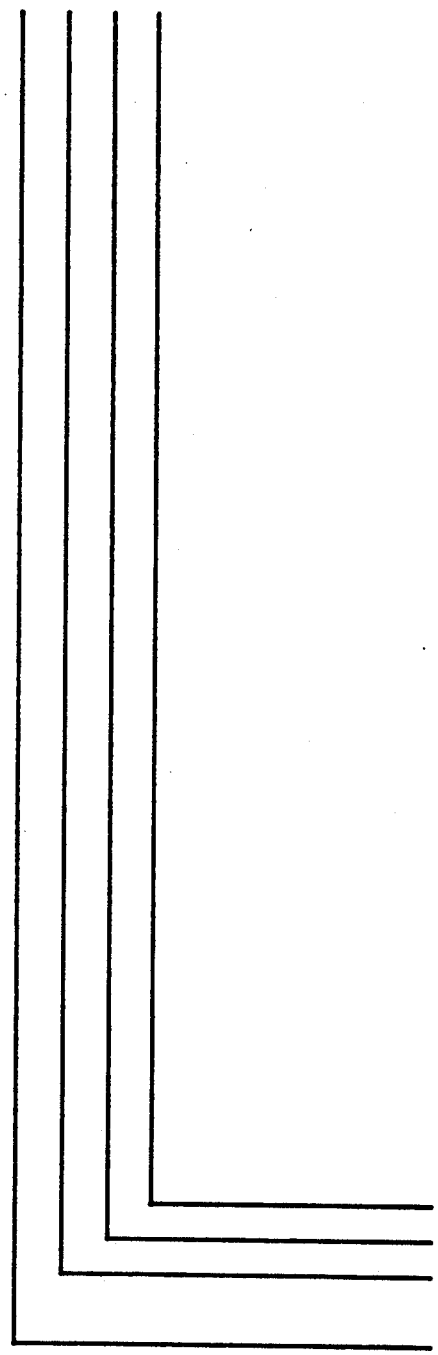
Figure 9D:
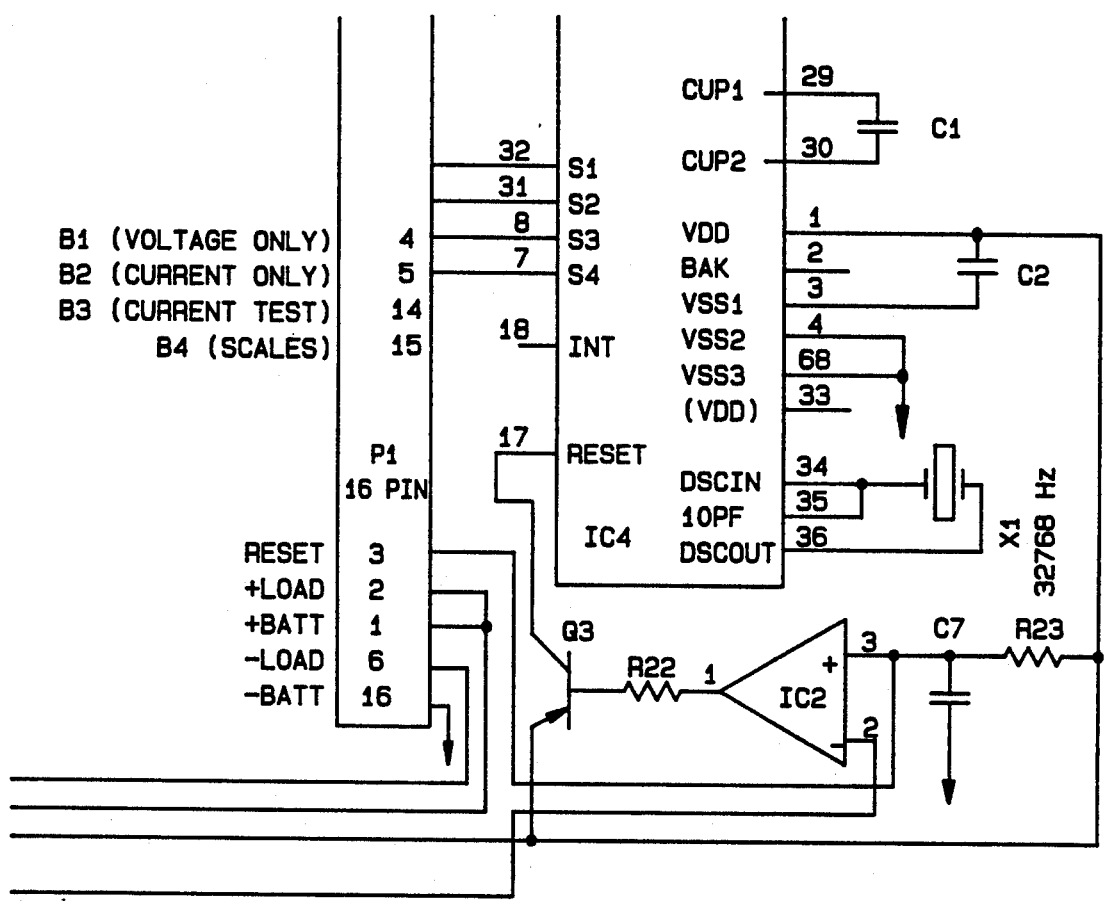

Connector 29 contains a number of specific conductors. Conductor 27 is the common or ground connection which is coupled to system ground. Conductors 138, 141, 144, and 146-156 are coupled via flexible cable 21 to the corresponding pins of microprocessor 18 as shown in FIGS. 2 and 8.

Figure 4:
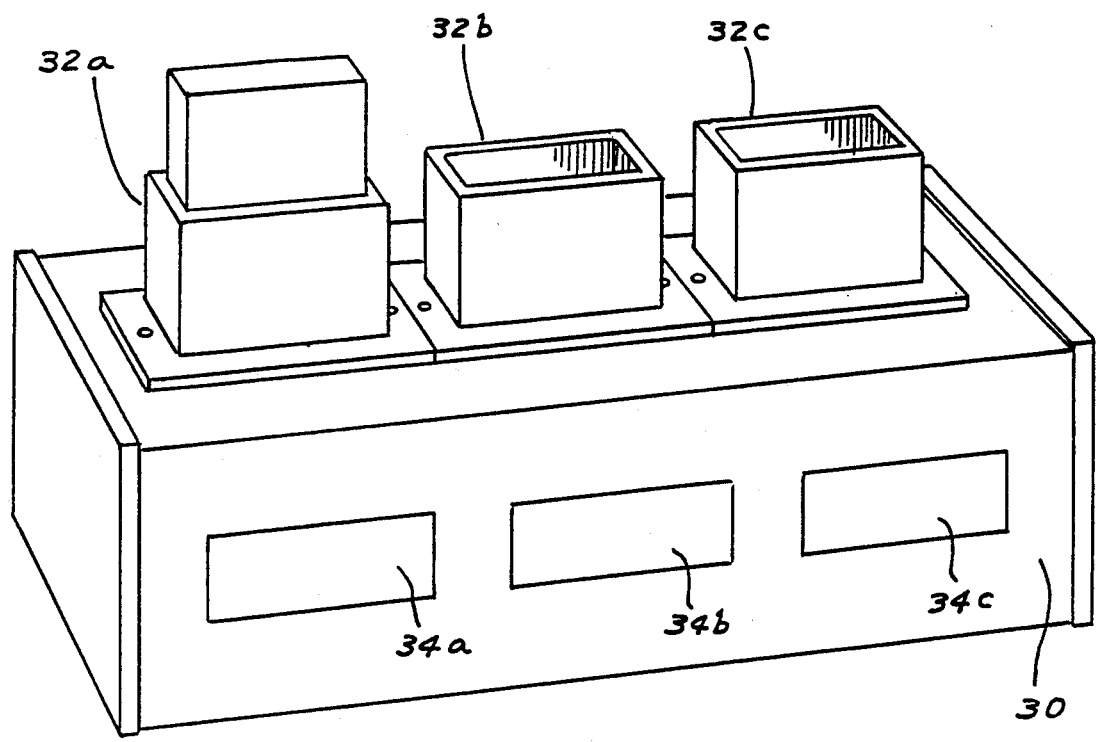
FIG. 4 illustrates the battery system for reading the voltage and charge status of each battery inserted into a battery charger.

FIG. 4 illustrates a perspective view of the battery monitoring system mounted within a battery charger 30. There is a separate monitoring system 20 for each one of the battery charging slots 32a-32c. Each of the three separate monitoring systems 20 has a separate display 34a-34c such that any battery plugged into one of the battery charging slots 32a-32c may be monitored by the corresponding display 34a-34c.

Figure 5:
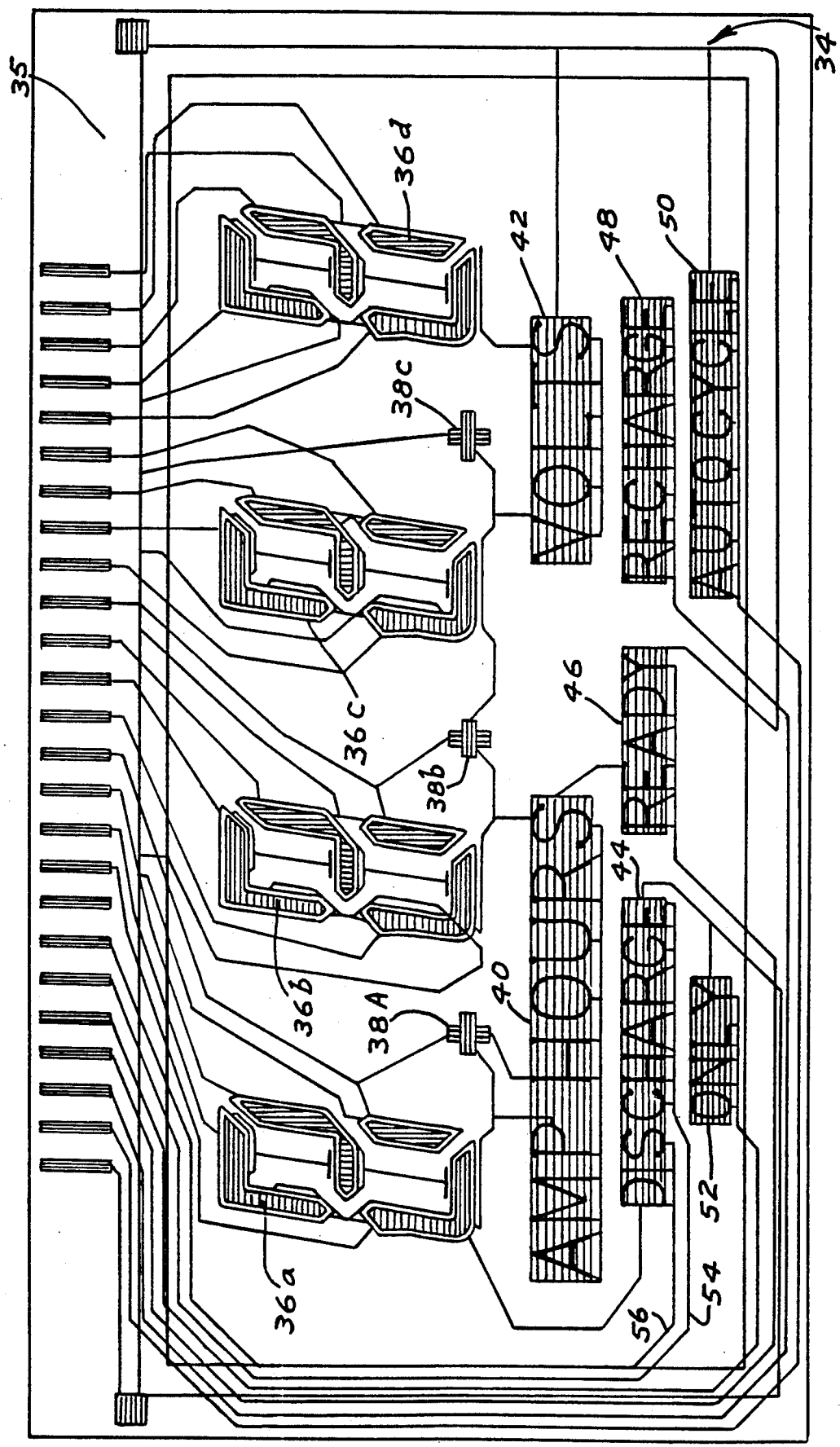
FIG. 5 illustrates an enlarged view of the display for a monitor mounted within a battery charger.

FIG. 5 illustrates a plan view of a display 34 including numerals 36a-36d, decimal points 38a-38c, and display verbiage of amp hours 40, volts 42, charge and discharge 44 in one display word, ready 46, recharge 48, autocycle 50, and only 52. The charge and discharge display verbiage 44 is connected by two illuminating wire circuits 54 and 56 so that there is a need for only one display word in two syllables on the display 34. As with LCD display 12, display 34 has a connector 35 which couples to flexible cable 21 (see also FIG. 2). Ideally, connector 35 is laid out as pin-compatible with connector 27 such that display 34 can be directly cabled via flexible cable 20 to microprocessor 18 instead of LCD display 12. The term condition can be used in lieu of the term autocycle.

Figure 6:
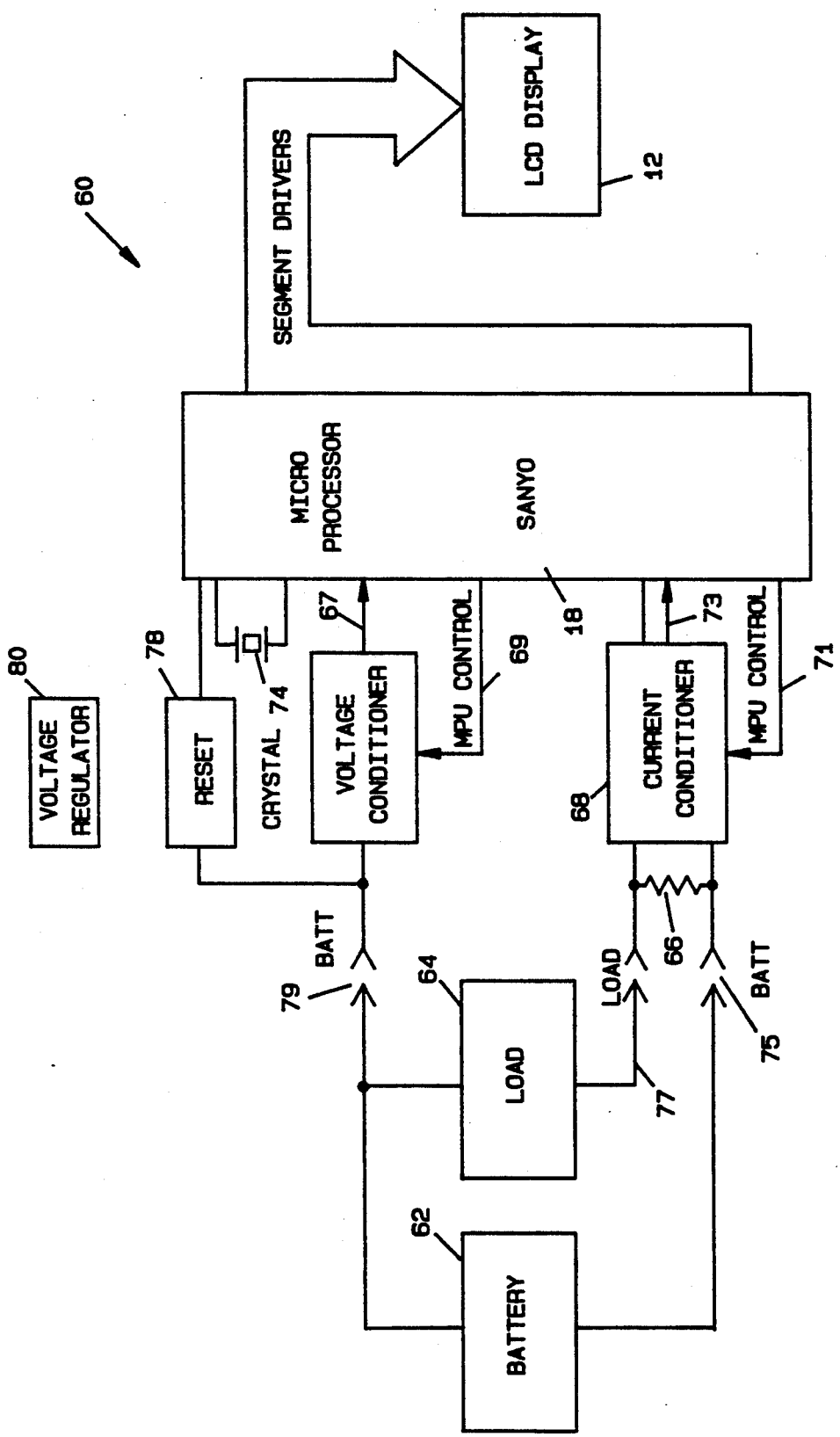
FIG. 6 illustrates a block diagram of the battery system for reading the voltage and charge status of a battery.

FIG. 6 illustrates a block diagram 60 of the battery system 10, including a battery 62, a load 64, a shunt resistor 66, current conditioner 68, a voltage conditioner 70, and microprocessor 18 with a crystal 74 which drives the LCD display 12 (or display 34 in the alternative embodiment of FIGS. 5 and 6).

In operation, battery 62 supplies power to load 64 as shown. The remaining elements are present to practice the subject invention. These components may be fixedly wired to battery 62 or may be connected via single conductor connectors 75, 77 and 79 as shown.

Insertion of connectors 77 and 75 require that all of the current flow between battery 62 and load 64 flows through shunt resistor 66 or very high impedance current conditioner 68. As is generally known in the art, shunt resistor 66 is of very low resistance, but very high precision such that most of the current flow between load 64 and battery 62 flows through shunt resistor 66. Current conditioner 68 is thus a high impedance, high precision voltage measuring device for measuring the voltage drop across the very small resistance of shunt resistor 66 for essentially all of the current flow between load 64 and battery 62. This voltage measurement is easily converted into current using Ohm's law by using the resistance of shunt resistor 66. Current conditioner 68 is controlled by microprocessor 18 via line 71 and sends voltage measurements to microprocessor 18 via line 73. Current conditioner 68 is discussed in more detail below.

Voltage conditioner 70 is coupled to the positive terminal of battery 62 via connector 79. Voltage conditioner 70 measures and digitizes battery voltage as described in more detail below. Voltage conditioner 70 is controlled by microprocessor 18 via line 69 and transmits digitized voltage measurements to microprocessor 18 via line 67.

Reset 78 is single pole single throw switch which generates an interrupt to microprocessor 18 to reset the current integration process and the voltage measurement averaging as explained in more detail below. Voltage regulator 80 provides a voltage standard for comparison purposes as explained in more detail below.

Figure 7:
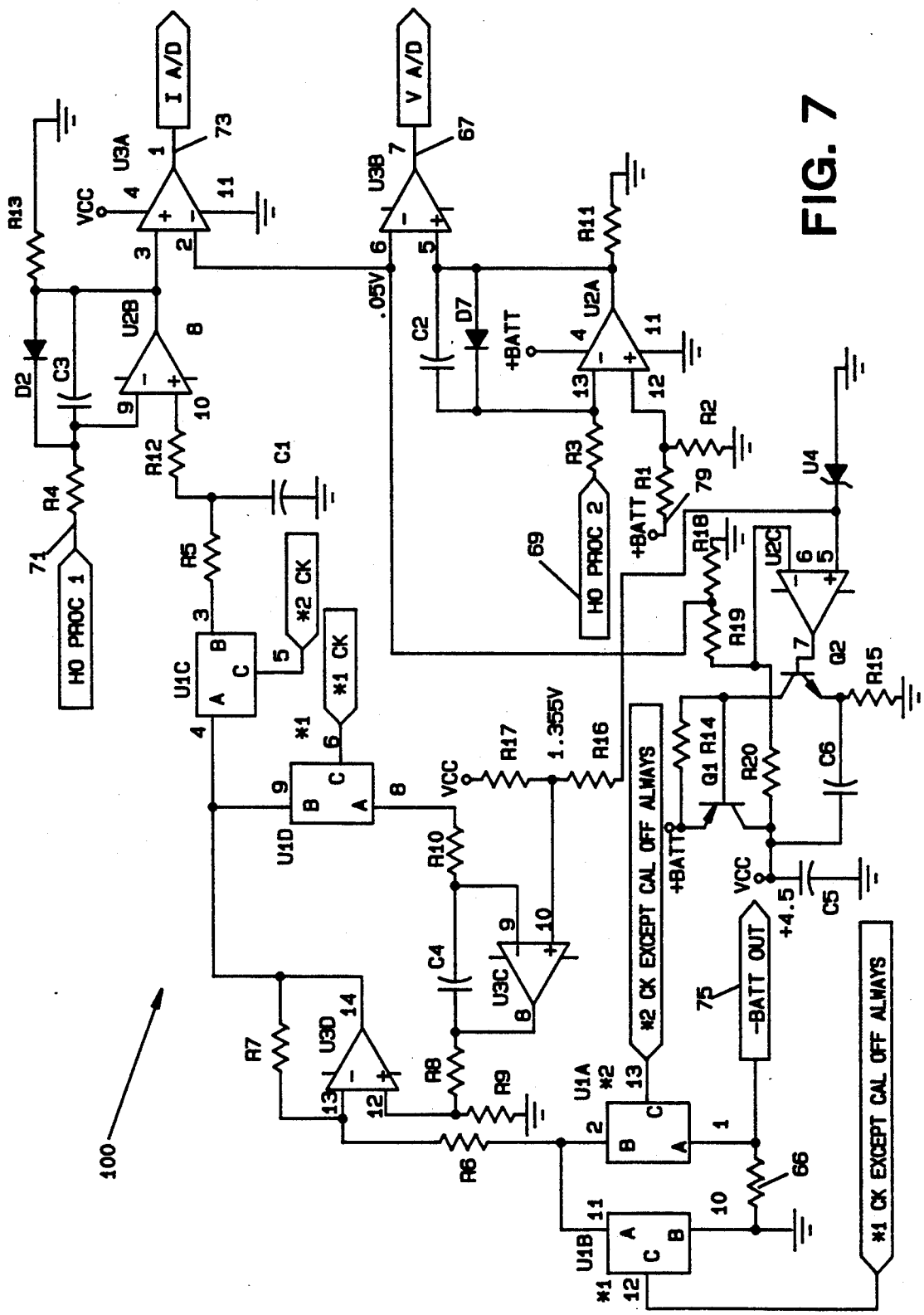
FIG. 7 illustrates a circuit diagram for the current conditioner, the voltage conditioner, and associated circuitry.

FIG. 7 illustrates the electrical circuit schematic diagram 100 of current conditioner 68, voltage conditioner 70, and voltage regulator 80.

The voltage regulator 80 includes a reference diode U4, a differential amplifier U2C, an NPN drive transistor Q2, a PNP pass transistor Q1, voltage divider R18, R19, and R20, filter capacitor C5, stabilizing capacitor C6, and biasing resistors R14 and R15.

The purpose of the voltage regulator circuit is to convert the variable battery voltage to a constant 4.5 volt value. This constant regulated voltage supplies power to the entire circuit including the microprocessor 18. It is this constant voltage driving the microprocessor control lines 69 and 73 which permits the automatic calibration of the voltage and current measurement circuitry.

The regulated output voltage is divided by R20 and the series combination of the R18 and R19 and connected to the inverting input of operational amplifier U2C. The positive input of U2C is held at a constant 1.2 volts by the reference diode U4. The difference between the divide output voltage and the reference is amplified by U2C and used to control the drive transistor Q2. Q2 then controls the pass transistor Q1 to force the output to 4.5 volts so that the amplified error voltage is zero. R18 and R19 further divide the output voltage to a 0.05 volt level that is used as a trip point for the comparators U3A and U3B. The absolute accuracy of this trip point is not critical to the accuracy of the conversion.

The voltage conditioner 70 includes an operational amplifier U2A, a comparator U3B, a voltage divider R1 and R2, an integrating current set resistor R3, an integrating capacitor C2, and a protection diode D7. Resistor R11 helps the output of amplifier U2A sink more current when it is close to the negative rail.

The battery voltage is divided by resistors R1 and R2 to scale it to an appropriate level for the converter. This voltage becomes a reference to the operational amplifier U2A, and controls the integrating charge and discharge current. The integrating current set resistor R3 and integrating capacitor C2 provide an integrating function as explained below. The protection diode D7 clamps the reverse voltage on the integrating capacitor when the circuit is not in use.

The actual voltage measurement is made by observing the times at which the comparator output changes state. The output of this comparator is supplied to one of the digital inputs of the microprocessor 18 so that these times can be accurately measured. When the conversion starts, the output of the comparator is held low because the control line 69 is high. When the conversion starts, this control line 69 is taken low and the integration capacitor 62 starts charging with the current created by the input reference voltage divided by resistor R3. When the output of the integrator passes the 0.05 volt threshold of the comparator, the comparator output 67 goes high to signal that the conversion has started and the microprocessor 18 should start timing. A fixed amount of time later, the control output 69 goes high which is the same as the 4.5 volt regulator because that is the supply to the microprocessor 18. This causes the integrating capacitor to discharge with a current of 4.5 volt minus the reference divided by resistor R3. When the integrator output passes the 0.05 volt threshold of the comparator, the output of the comparator goes low again signaling to the microprocessor 18 that the conversion is finished. The ratio of the charge time to the discharge time is mathematically representative of the ratio between the 4.5 volt reference supply and the battery voltage. By performing the appropriate mathematics, the battery voltage can be determined from the comparator output timing.

The current conditioner 68 includes shunt resistor 66 which develops voltage being measured and is a dropping resistor for current sensing. The value and precision of this resistor is critical as explained above. Shunt resistor 66 is coupled between the negative terminal of battery 62 and load 64 (see also FIG. 6). U1A and U1B are analog multiplexers. These permit calibration of the current sensor amplifier U3D. R6 sets the gain of amplifier U3D that amplifies the voltage measured across shunt resistor 66 with the negative input pin becoming a summing junction for feedback supplied by feedback resistor R7. U1C and U1D are also analog multiplexers providing switching voltages for control of the offset cycle. The current amplifier switches between offset calibration mode and signal amplification mode many times a second. In calibration mode switches U1B and U1D are on. This sets the amplifier input to ground and enables the operational amplifier U3C to set the output of amplifier U3D to 1.355 volts. When this cycle is over, C4 holds the last voltage that set these conditions so that during the amplification mode the output of U3D is always referenced to 1.355 volts. During the amplification mode switches U1A and U1C are turned on to allow the amplified current to be sensed. Capacitor C1 stored this output when U1C opens during the calibration mode. R12 ensures that the input impedances to U2B are matched, reducing the input offset current error.

FIG. 8 illustrates the electrical circuit connections to the microprocessor 18 and between the microprocessor and the LCD display. The microprocessor is a Sanyo LC5851H 4-bit microcomputer by way of example and for purposes of illustration only, and not to be construed as limiting of the present invention. Other 4-bit microprocessors can be utilized.

Microprocessor 18 contains the digital inputs for both voltage and current measurements received via lines 67 and 73, respectively. It also contains the digital output control lines 69 and 71 for voltage and current measurement. Control of microprocessor 18 is via the software as described below.

DESCRIPTION OF THE ALTERNATIVE EMBODIMENT

FIG. 9 illustrates an alternative embodiment of the circuits of FIGS. 7 and 8. A careful analysis will show that the circuit is nearly identical with that explained above. One key difference is the use of an automated circuit to reset the system in place of the manual reset by single pole-single throw switch 78. Referring to FIG. 9, this automatic reset circuit includes PNP drive transistor Q3, coupling resistor R22, operational amplifier 1C2 and RC network C7/R23. The reset occurs automatically upon insertion of a battery. The remaining changes incorporated into the alternative embodiment are minor circuit details.

MODE OF OPERATION

The electronics and electric circuit are based on the Sanyo LC5851H 4-bit microcomputer, CMOS analog switches, and two LM324 op-amps. The voltage and current readings are taken from dual-sloped converters and the values determined by software algorithms.

Operation of the voltage dual-sloped converter is with the two LM324 op-amps. The battery voltage is input to pin 3 of U2A through a voltage divider (see FIG. 7). Pin 2 is controlled by the microprocessor to enable and disable the integration function as explained above. The output from U2A is to U3B to be compared to the fixed reference voltage. The diode across the capacitor C3 limits the reverse bias while the circuitry is not in use. The output is sent to a digital input port on the microcomputer.

The dual-sloped converter is implemented by allowing C2 to charge for a fixed period of time after which the discharge rate is determined by the voltage on U3B pin 3. The software algorithm for the voltage is:

$$\text{BATTERY VOLTAGE} = 38.3 * X/(200+x)$$

where "x" represents the number of counts the microcomputer acquired during the discharge time of the integrator. The charge time is fixed at 196 milliseconds. Each count represents 976 microseconds of discharge time.

The analog multiplexer offsets the ground reference so that positive or negative voltages from the current sense resistor can be used by the integrator. This is accomplished with the analog switches and the op-amps. The ground reference is offset by U3C which has its positive input held at 1.355 volts with a voltage reference and a voltage divider.

When the U1D analog switch is gated ON, the capacitor C4 charges to a voltage that will balance the circuit to zero volts plus the voltage reference offset. When it is gated OFF and the U1C analog switch is ON, then C1 is charged by the differential between pins 12 and 13 of U3D. U3D is a high gain amp with its positive input reference above ground. The voltage at C1 is used by the integrator U2B.

The software algorithm for current is:

$$\text{CURRENT} = 9.8 * x/(200+X)$$

where "x" represents the number of counts the microcomputer counted during the discharge time of the integrator. The charge time is fixed at 196 milliseconds. Each count represents 976 microseconds of discharge time.

The transistors Q1 and Q2, and U2C form a voltage regulator. A low voltage drop across Q1 is required to maintain regulation. This voltage regulator can operate from a minimum battery voltage of 4.8 volts while producing a 4.5 volt regulated output. This allows the circuit to operate from a 6.0 volt battery discharged to 80% of its normal output, which is what most manufacturers consider a discharged state.

Software Description

The software can be divided into four modules: Offset 200, Current 202, Voltage 204, and Display 206.

Figure 10A:
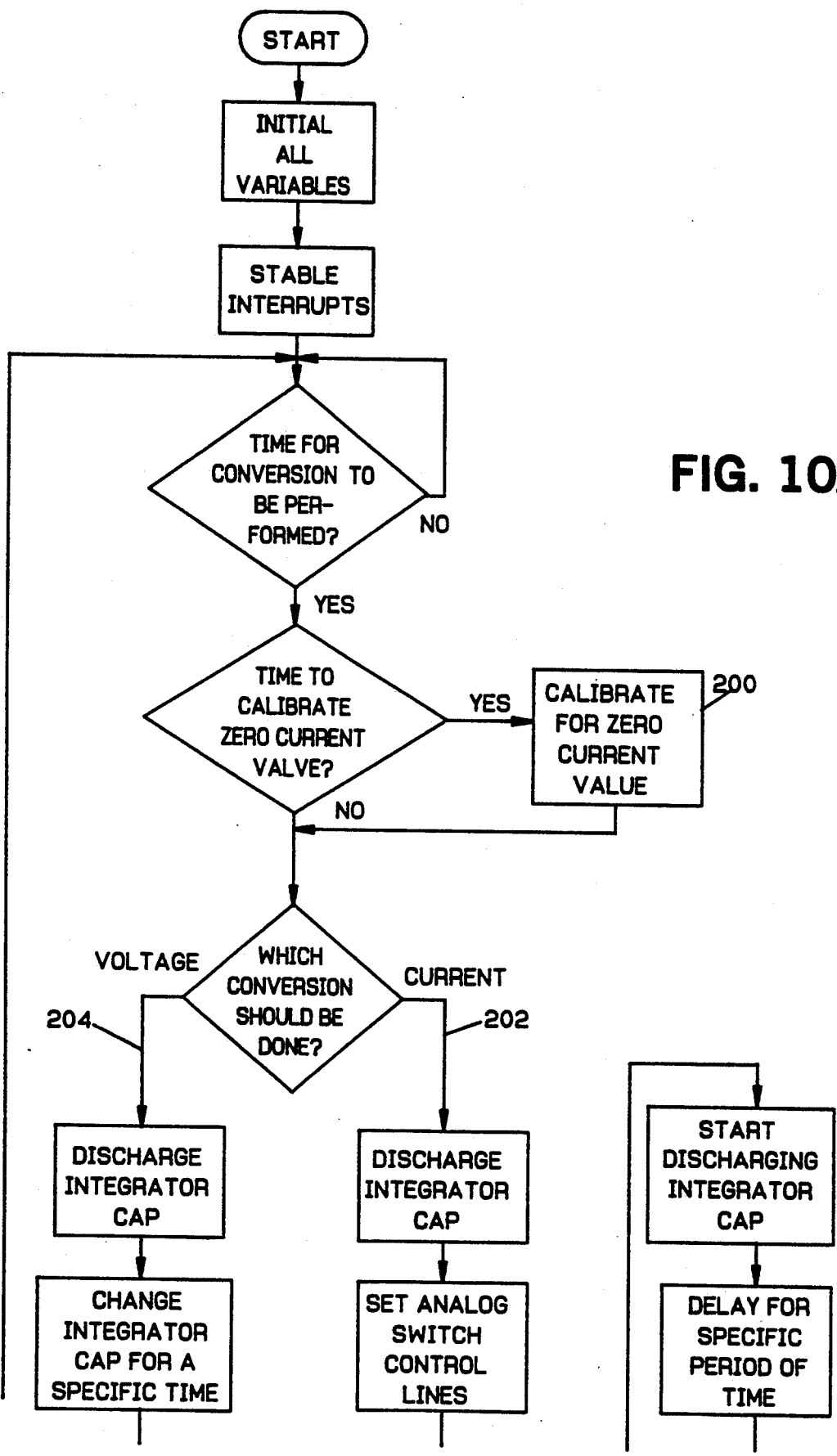
Figure 10B:
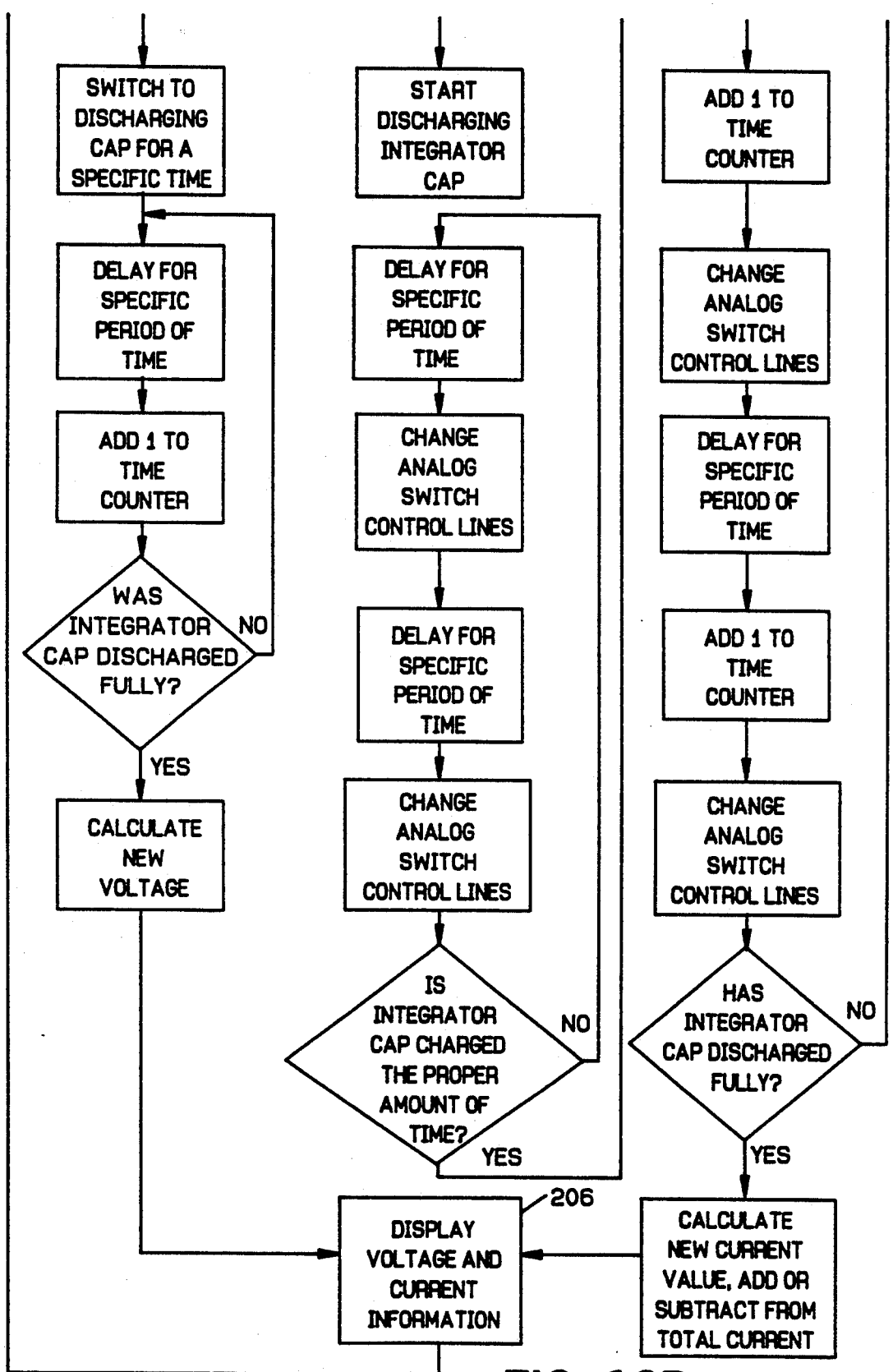
Figure 11:
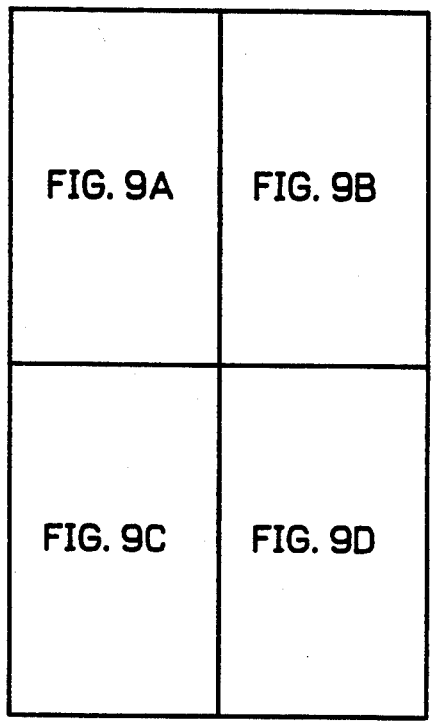
FIG. 11 illustrates how

FIG. 10 illustrates the flow chart of the software.

The Offset module 200 is the first to execute. This module reads the current count for ZERO current or what might be thought of as a calibrate current. This is done so that the microcomputer knows how much to subtract from all current readings for the actual current value.

In this routine the U1A gate is not allowed ON and the U1B gate is always ON. U1C and U1D alternate states. The analog gates are activated in the following sequence: 4, 6, 4, C. This sequence reduces system noise as opposed to simply alternating the control lines, remembering the U1A is OFF and U1B is ON at all times during this routine.

The Offset module is also executed every minute to recalibrate the electronics and to average any errors from noise that may have been introduced into the system.

The Current module 202 is part of three modules which execute at all times after the Offset module. The analog gates are sequenced differently in this portion of the software than in the Offset module. The gates in this module are activated in the following sequence: 4, C, 1, 3.

The current integration is performed first, followed by the current calculation as described earlier. The direction of the current flow is determined by subtracting the value from the Offset number.

The absolute value is then added/subtracted from the CONSUMED current and the absolute number is stored in registers so that in a test mode the absolute number can be displayed. If the unit has had current discharged from it when the battery charger is attached, the display will start counting toward 0.000. A short pulse from PORT B0 will be output to indicate that the CONSUMED current has reached 0.000. The charger will switch into a trickle charge mode. The display will stay at 0.000 until current is consumed from the battery.

The Voltage module 204 executes at all times after the Offset module. The voltage integration is performed and the value of the voltage is determined. The decimal number is stored.

The Display module displays the appropriate information on the display and checks for special display modes like VOLTAGE ONLY, CURRENT ONLY and CURRENT TEST. This module also calls the Offset module once every minute to recalibrate the ZERO current number. The special mode can be enabled by applying +4.5 volts on one of the following pins at a time:

S0 PORT 80 = ¢ display only voltage
S1 PORT 81 = ¢ display only current
S2 PORT 82 = ¢ display current for testing There are other support modules in the software which perform timings, division, multiplication and hex to bcd conversions as illustrated in the flow charts.

The source code and six sheets of flow charts for the software is attached as Appendix 1.

The display code for the LCD is attached as Appendix 2.

```
; * PORT DEFINITIONS
;
;       PORT P0             CONTROL #2 - OFF for calibrate, pin 13 of 4066
;            P1             CONTROL #2 - pin 5 of 4066
;            P2             CONTROL #1 - ON for calibrate, pin 12 of 4066
;            P3             CONTROL #1 - pin 6 of 4066
;
;       ALARM               HIGH OUTPUT CONTROL #2 FOR VOLTAGE
;       LIGHT               HIGH OUTPUT CONTROL #1 FOR CURRENT
;
;       PORT A0             VOLTAGE A/D INPUT
;            A1             CURRENT A/D INPUT
;            A2             input #1
;            A3             input #2
;
;       PORT M0             input #3
;            M1             input #4
;            M2             input #5
;            M3             input #6
;
;       PORT S0             DISPLAY ONLY VOLTAGE
;            S1             DISPLAY ONLY CURRENT
;            S2             DISPLAY INSTANT CURRENT
;            S3             DISPLAY SCALE NUMBERS
;
;       PORT B              bit 0 = pulse at zero current
;                           bit 1 = doing voltage conversion
;                           bit 2 = doing current conversion
;                           bit 3 = divider interupt service
;
;
; * RAM DEFINTIONS volt2:  equ     0           ;displayed VOLTAGE
volt1:  equ     1
volt0:  equ     2 curr6:  equ     3           ;displayed CURRENT
curr5:  equ     4
curr4:  equ     5
curr3:  equ     6           ;addend starts here
curr2:  equ     7
curr1:  equ     8
curr0:  equ     9 icur2:  equ     0bh         ;displayed instant CURRENT
icur1:  equ     0ch
icur0:  equ     0dh
```

APPENDIX 1

```
isign:  equ     0eh offst3: equ     0fh         ;current offset
offst2: equ     10h
offst1: equ     11h
offst0: equ     12h avlt1:  equ     13h         ;8 registers for averaging the voltage readings
avlt0:  equ     14h bvlt1:  equ     15h
bvlt0:  equ     16h cvlt1:  equ     17h
cvlt0:  equ     18h dvlt1:  equ     19h
dvlt0:  equ     1ah
```

```
; blank space
mode:    equ    20h        ;display mode
                           ;bit 0 = 0 => displaying current
                           ;bit 0 = 1 => displaying voltage flag:    equ    21h        ;bit 0 = 1 => do a conversion
                           ;bit 1 = 1 => tell which conversion we are going t
                           ;bit 2 = 0 => first voltage reading portb:   equ    22h        ;image for port b output time:    equ    23h        ;reg for counting 2 secs to change display mode temp1:   equ    24h
temp2:   equ    25h
temp3:   equ    26h
temp4:   equ    27h
temp5:   equ    28h clkup:   equ    29h        ;clock register for current conversion outputs
clkdn:   equ    2ah        ;clock register for current conversion outputs fish1:   equ    2bh        ;registers for scale
fish2:   equ    2ch one:     equ    30h        ;register for holding 1
four:    equ    31h        ;register for holding 4

; blank space sec60:   equ    32h        ;60 second counter
bacc:    equ    33h        ;second acc
acc:     equ    34h        ;working acc
stkacc:  equ    35h        ;storage for acc
stkflg:  equ    36h        ;stoarge for flag
iacc:    equ    37h        ;interrupt acc wr0:     equ    38H        ;WORKING REGISTERS
wr1:     equ    39H
wr2:     equ    3AH
wr3:     equ    3BH
wr4:     equ    3CH
wr5:     equ    3DH
wr6:     equ    3EH wr7:     equ    3FH

;  * EQUATES sbit0:   equ    1          ;for setting bits
sbit1:   equ    2
sbit2:   equ    4
sbit3:   equ    8 rbit0:   equ    0eh        ;for resetting bits
rbit1:   equ    0dh
rbit2:   equ    0bh
rbit3:   equ    07h light:   equ    04h        ;light control
sres:    equ    20h        ;port s resistor control
mres:    equ    40h        ;port m resistor control
bak:     equ    02h        ;bakup mode is controlled inton:   equ    08h        ;enable divider int.
intoff:  equ    00h        ;dis-able interrupts
```

```
; * LCD PORTS dis0:   equ     2               ;left hand digit
dis1:   equ     3
dis2:   equ     4
dis3:   equ     5               ;right hand digit
dp:     equ     6               ;decimal point
lcdflg: equ     7               ;lcd flags
                                ;bit0 = "ma / hrs"
                                ;bit1 = "volts"

latch0: equ     8               ;bit2 - bit 3 => from port A
latch1: equ     9               ;bit0 - bit 3 => from port M

;----------------------------------------------------------------- begin:  org     0000h
        sic     intoff          ;make sure interrupts are off now
        call    clrdsp          ;clear display on reset
        jmp     cold org     001ch           ;1/2 divider interrupt
divint:
        sta     stkacc          ;save off the acc
        maf     stkflg          ;save off the flags ipa*    iacc            ;display external latch bits
        wrp     latch0,iacc
        ipm     iacc
        wrp     latch1,iacc
;/*test interrupt response*/
        lds     iacc,sbit3      ;pulse to port b
        or*     portb
        oiob    portb sf      sres            ;pulse resistor control
        rf      sres lds     iacc,1          ;sub 1 from 4 sec counter
        sub*    time
        banz    divret          ;jump if not zero lds     time,4          ;reload 2 sec counter
        lds     iacc,sbit0      ;change display mode
        eor*    mode bab0    divcnt          ;test for 4 seconds
        lds     iacc,1
        sub*    sec60           ;sub 1 from 60 second counter
        banz    divcnt          ;jump if not 60 seconds yet
        lds     sec60,0fh       ;reload counter
        lds     iacc,sbit1      ;flag mainline to do current offset adjust
        or*     mode divcnt: lds     iacc,sbit0      ;flag main to do a conversion
        or*     flag divret:
;/*test interrupt response*/
        lds     iacc,rbit3      ;pulse to port b
        and*    portb
        oiob    portb mra     stkflg          ;restore flags
        lda     stkacc          ;restore acc
        sic     inton           ;re-enable interrupts
        rts
```

```
;--------------------------
;
; continuation of reset code cold:   lds     acc,0               ;set port B to output
        oiob    acc
        rf      bak                 ;make sure backup mode is off lds     mode,1              ;display current on reset
        lds     flag,0              ;clear flag reg on reset lds     volt2,0             ;clear voltage on reset
        lds     volt1,0
        lds     volt0,0 lds     fish2,0             ;fish scale registers
        lds     fish1,0 lds     one,1               ;register for holding 1
        lds     four,4              ;register for holding 4 call    clrcur              ;clear current registers lds     icur2,0             ;clear instant current reg on reset
        lds     icur1,0
        lds     icur0,0
        lds     isign,0
        lds     sec60,0fh           ;init 60 second counter call    a2doff              ;calibrate current
        sic     inton               ;enable interrupts ;@@@@@@@@@@@@@@@@@@@@@@@@@@@@@@@@
main:
        lda     flag                ;check for time to do a conversion
        bab0    maincv              ;jump should do a conversion
        jmp     main                ;else wait until time
maincv:
        lds     acc,rbit0           ;clear conversion flag
        and*    flag lda     mode                ;test for current offset adjust
        bab1    maincr              ;jump if time to redo offset
        jmp     mainok              ;jump if not time to do offset
maincr: call    a2doff              ;call routine that adjusts offset for current
        lds     acc,rbit1           ;turn off bit
        and*    mode mainok: ips     acc                 ;test for special modes
        bab3    a2dvlt              ;special mode for scale lds     acc,sbit1           ;change which conversion we are going to do
        eor*    flag
        bab1    a2dvlt              ;jump to convert voltage
        jmp     a2dcur              ;jump to convert current pdate:
        lds     acc,9               ;turn off both flags, done the conversion
        and*    portb
        oiob    portb ips     acc                 ;test for single display
        bab0    dspvlt              ;display voltage
        bab1    dspcur              ;display current
        bab2    dspicr              ;display instant current
        bab3    dspfsh              ;display weight lda     mode                ;check for display mode
        bab0    dspvlt              ;jump if displaying voltage
```

```
spcur:  wrt     dis3,curr6          ;display msn of current
        wrt     dis2,curr5
        wrt     dis1,curr4
        wrt     dis0,curr3
        lds     acc,sbit1           ;display "ma/hour"
        wrp     lcdflg,acc
        lds     acc,0               ;erase dp reg
        wrp     dp,acc
        jmp     main spvlt:  wrb     dis2,volt2          ;display msn voltage
        wrt     dis1,volt1
        wrt     dis0,volt0 lds     acc,0               ;no hundreds digit, so blank digit
        wrp     dis3,acc
        wrp     dp,acc              ;erase dp reg
        lds     acc,sbit0           ;display "volt"
        wrp     lcdflg,acc
        jmp     main spicr:
        wrt     dis2,icur2          ;display msn of instant current
        wrt     dis1,icur1
        wrt     dis0,icur0
        lds     acc,sbit1           ;display "ma/hour"
        wrp     lcdflg,acc
        lds     acc,0               ;erase dp reg
        wrp     dp,acc lda     isign               ;check for 'minus' sign baz     dspisp              ;jump if 'plus' sign lds     bacc,4              ;"-"
dspisp: wrp     dis3,acc            ;display sign
        jmp     main dspfsh:
        call    clrwr4              ;start with wr = 0
        mrw     wr4,fish2           ;assume less than 10
        subi    wr4,10              ;sub 10
        bcnh    dspfh0              ;jump if less than 10
        sta     wr4                 ;store the remainder
        lds     wr3,1 dspfh0: mrw     wr2,fish1
        subi    wr2,10              ;sub 10
        bcnh    dspfh1              ;jump if less than 10
        sta     wr2
        lds     wr1,1 dspfh1: wrb     dis3,wr1            ;display msn of weight
        wrt     dis2,wr2
        wrb     dis1,wr3
        wrt     dis0,wr4
        lds     acc,sbit1           ;display "ma/hour"
        wrp     lcdflg,acc
        lds     acc,0               ;erase dp reg
        wrp     dp,acc
        jmp     main ;end of main line loop
;@@@@@@@@@@@@@@@@@@@@@@@@@@@@@@@@@

;----------------------------------
;   SUBROUTINES clrdsp: lds     acc,0               ;clear display routine
        wrp     dis3,acc
```

```
         wrp      dis2,acc
         wrp      dis1,acc
         wrp      dis0,acc
         wrp      dp,acc            ;clear decimal points
         wrp      lcdfls,acc        ;clear flags
         wrp      latch0,acc        ;external display flags
         wrp      latch1,acc
         rts clrtmp:  lds      temp1,0           ;clear temp registers
         lds      temp2,0
         lds      temp3,0
         lds      temp4,0
         lds      temp5,0
         rts clrwr4:  lds      wr4,0             ;clear working register area
clrwr:   lds      wr3,0
         sta      wr2
         sta      wr1
         sta      wr0
         rts clrcur:  lds      curr6,0           ;clear current registers
         lds      curr5,0
         lds      curr4,0
         lds      curr3,0
         lds      curr2,0
         lds      curr1,0
         lds      curr0,0
         rts ;@@@@@@@@@@@@@@@@@@@@@@@@@@@@@@@@
;
; software for converting the current
;
a2dcur:  ips      acc               ;set options
         bab0     update            ;exit out if displaying only voltge
         bab3     update            ;exit out if displaying only fish scale lds      clkup,0ch         ;setup for clocks to analog switches
         lds      clkdn,03h
         lds      acc,sbit2         ;flag that conversion is happening
         or*      portb
         oiob     portb
         call     clrwr4            ;start with wr = 0 lds      wr0,2             ;clock 2 clocks to begin with
setcur:  opp      four              ;flip-flop clock to converters
         opp      clkup
         nop
         nop
         nop
         nop
         nop
         nop opp      one               ;flip-flop clock to converters
         opp      clkdn
         nop
         nop
         nop
         nop
         subi*    wr0,1
         banz     setcur sf       light
tme@1:   opp      four              ;flip-flop clock to converters
         opp      clkup
         addi*    wr2,1             ;check for max negative current
```

```
         adci*    wr1,0
         adci*    wr0,0
         bab1     ovfcur          ;count overflow for current, 512 counts
         nop
         nop
         nop opp      one             ;flip-flop clock to converters
         opp      clkdn
         nop
         nop
         nop
         nop ipa*     acc
         bab1     tme@I           ;Jump if not ready to start conversion
                                  ;else start conversion sic      intoff
         rf       light
precur:  lds      wr0,0           ;registers for checking for max current
         lds      wr1,0 pre@I:   opp      four            ;flip-flop clock to converters
         opp      clkup
         nop
         addi*    wr1,1
         adci*    wr0,0
         bab3     curovr          ;count overflow for current, 128 counts
         ipa*     acc
         bab1     wtI200          ;Jump if ready to start conversion opp      one             ;flip-flop clock to converters
         opp      clkdn
         nop
         nop
         nop
         ipa*     acc
         bab1     wtI200          ;Jump if ready to start conversion
         Jmp      pre@I           ;else loop wtI200:  lds      wr1,03h         ;set wr to 100 for 1st slope
         lds      wr0,06h         ;063h = 99, but checks for underflow wtI202:  opp      four            ;flip-flop clock to converters
         opp      clkup
         nop
         nop
         nop
         nop
         nop
         nop opp      one             ;flip-flop clock to converters
         opp      clkdn
         nop
         nop
         nop
         subi*    wr1,1           ;sub 1 from 100 count
         sbci*    wr0,0
         bch      wtI202          ;Jump if has not generated a carry sf       light           ;start 2nd slope
cnvI:    opp      four            ;flip-flop clock to converters
         opp      clkup
         addi*    wr1,1           ;add to count registers
         adci*    wr0,0           ;carry
         nop
         nop
         ipa*     acc             ;read port bit0
```

```
        babl       *+2              ;Jump back if still reading counts
        Jmp        cmpcur           ;done with counting opp        one              ;flip-flop clock to converters
        opp        clkdn
        addi*      wr1,1            ;add to count registers
        adci*      wr0,0            ;carry
        subi       wr0,0fh          ;check for more than 230 counts (plus some)
        baz        cmpcur           ;jump if more than 230
        ipa*       acc              ;read port bit0
        babl       cnvI             ;Jump back if still reading counts
        Jmp        cmpcur           ;done with counting
```

; overfow for second slope of conversion, max postive current
```
curovr: lds        wr1,0            ;set registers for 0 counts
        lds        wr0,0
        Jmp        cmpcur
```

;
; overfow for first slope of conversion, max negative current
;
```
ovfcur: lds        wr1,0            ;set registers for 240 counts
        lds        wr0,0fh
```

;
; compute current
;
```
cmpcur: rf         light            ;make control inactive
        sic        inton
        lds        acc,0eh          ;resting state of the analog swithes
        opp        acc mrw        wr7,wr1          ;transfer time count to other registers
        mrw        wr6,wr0
        lds        wr5,0 addi*      wr7,8            ;add 200 to count
        adci*      wr6,0ch
        adci*      wr5,0            ;have denominator now
```

; changed the code below to 980 for CURRENT
; resolution would be 0.0x amperes

;multiply value by 980
```
        call       clrtmp
        mwr        temp1,wr0        ;transfer to count to temp registers
        mwr        temp2,wr1 curlp:  lds        temp3,3          ;load 980 into registers
        lds        temp4,0dh
        lds        temp5,4
        call       multpy           ;call multiply routine call       divide           ;(count * 980)/(200 + count) = current in x
;answer is in wr0-wr4
```

; wr0-wr4 has instant current in decimal x.xxx

```
        lda        wr4              ;trial subtraction to determine if negative
        sub        offst0
        sta        temp4            ;store negative or positive number lda        wr3
        sbc        offst1
        sta        temp3            ;store negative or positive number lda        wr2
        sbc        offst2
        sta        temp2            ;store negative or positive number
```

```
        lda     wr1
        sbc     offst3
        sta     temp1

;check for negative current, charging condition
        bcnh    negcur                  ;jump if negative current lds     isign,0                 ;flag for 'plus' current
        call    hexbcd                  ;convert temp reg. to bcd
;discharging current
        lda     wr4                     ;real addition for 1/10 of current value
        add*    curr0
        bch     *+4                     ;must adjust if carry
        lds     acc,10                  ;decimal adjust
        sub     curr0
        bcnh    *+5
        lds     acc,10                  ;decimal adjust
        sub*    curr0
        lds     acc,1
        add*    curr1 lda     wr3
        add*    curr1
        bch     *+4                     ;must adjust if carry
        lds     acc,10                  ;decimal adjust
        sub     curr1
        bcnh    *+5
        lds     acc,10                  ;decimal adjust
        sub*    curr1
        lds     acc,1
        add*    curr2 lda     wr2
        add*    curr2
        bch     *+4                     ;must adjust if carry
        lds     acc,10                  ;decimal adjust
        sub     curr2
        bcnh    *+5
        lds     acc,10                  ;decimal adjust
        sub*    curr2
        lds     acc,1
        add*    curr3 lda     wr1
        add*    curr3
        bch     *+4                     ;must adjust if carry
        lds     acc,10                  ;decimal adjust
        sub     curr3
        bcnh    *+5
        lds     acc,10                  ;decimal adjust
        sub*    curr3
        lds     acc,1
        add*    curr4 lda     wr0
        add*    curr4
        bch     *+4                     ;must adjust if carry
        lds     acc,10                  ;decimal adjust
        sub     curr4
        bcnh    *+5
        lds     acc,10                  ;decimal adjust
        sub*    curr4
        lds     acc,1
        add*    curr5 lds     acc,10                  ;decimal adjust
        sub     curr5
        bcnh    *+4
        sta     curr5
```

```
lds     acc,1
add*    curr6 lds     acc,10          ;decimal adjust
sub     curr6
bcnh    *+3
call    clrcur          ;overflow in cour  s
jmp     curren lda     wr4             ;real addition for current value
add*    curr1
bch     *+4             ;must adjust if carry
lds     acc,10          ;decimal adjust
sub     curr1
bcnh    *+5
lds     acc,10          ;decimal adjust
sub*    curr1
lds     acc,1
add*    curr2 lda     wr3
add*    curr2
bch     *+4             ;must adjust if carry
lds     acc,10          ;decimal adjust
sub     curr2
bcnh    *+5
lds     acc,10          ;decimal adjust
sub*    curr2
lds     acc,1
add*    curr3 lda     wr2
add*    curr3
bch     *+4             ;must adjust if carry
lds     acc,10          ;decimal adjust
sub     curr3
bcnh    *+5
lds     acc,10          ;decimal adjust
sub*    curr3
lds     acc,1
add*    curr4 lda     wr1
add*    curr4
bch     *+4             ;must adjust if carry
lds     acc,10          ;decimal adjust
sub     curr4
bcnh    *+5
lds     acc,10          ;decimal adjust
sub*    curr4
lds     acc,1
add*    curr5 lda     wr0
add*    curr5
bch     *+4             ;must adjust if carry
lds     acc,10          ;decimal adjust
sub     curr5
bcnh    *+5
lds     acc,10          ;decimal adjust
sub*    curr5
lds     acc,1
add*    curr6 lds     acc,10          ;decimal adjust
sub     curr6
bcnh    curren
```

```
        call    clrcur          ;rollover condition, clear current resisters
        Jmp     curren          ;done for dischasing current
; end of discharging current ; start of charsing current
nescur:
        lds     isisn,0fh       ;flas for 'minus' current lda     offst0          ;subtraction for nesative
        sub     wr4
        sta     temp4           ;store nesative lda     offst1
        sbc     wr3
        sta     temp3           ;store nesative lda     offst2
        sbc     wr2
        sta     temp2           ;store nesative lda     offst3
        sbc     wr1
        sta     temp1

; have found difference in temp1 - temp4
        call    hexbcd
; answer in wr0 - wr4 lda     curr6           ;check for zero current
        or      curr5
        or      curr4
        or      curr3
        or      curr2
        or      curr1
        or      curr0
        baz     curren          ;exit if already at zero lda     wr4             ;subtraction for 1/10 of current value
        sub*    curr0
        bch     ncr1            ;Jump if no borrow
        lds     acc,10          ;decimal adjust
        add*    curr0
        call    adjst1          ;adjust all the rest of the resisters ncr1:   lda     wr3
        sub*    curr1
        bch     ncr2            ;Jump if no borrow
        lds     acc,10          ;decimal adjust
        add*    curr1
        call    adjst2          ;adjust all the rest of the resisters ncr2:   lda     wr2
        sub*    curr2
        bch     ncr3            ;Jump if no borrow
        lds     acc,10          ;decimal adjust
        add*    curr2
        call    adjst3          ;adjust all the rest of the resisters ncr3:   lda     wr1
        sub*    curr3
        bch     ncr4            ;Jump if no borrow
        lds     acc,10          ;decimal adjust
        add*    curr3
        call    adjst4          ;adjust all the rest of the resisters ncr4:   lda     wr4             ;subtraction for CURRENT value
```

```
           sub*    curr1
           bch     ncr5            ;Jump if no borrow
           lds     acc,10          ;decimal adjust
           add*    curr1
           call    adjst2          ;adjust all the rest of the registers ncr5:      lda     wr3
           sub*    curr2
           bch     ncr6            ;Jump if no borrow
           lds     acc,10          ;decimal adjust
           add*    curr2
           call    adjst3          ;adjust all the rest of the registers ncr6:      lda     wr2
           sub*    curr3
           bch     ncr7            ;Jump if no borrow
           lds     acc,10          ;decimal adjust
           add*    curr3
           call    adjst4          ;adjust all the rest of the registers ncr7:      lda     wr1
           sub*    curr4
           bch     curren          ;Jump if no borrow
           lds     acc,10          ;decimal adjust
           add*    curr4
           call    adjst5          ;adjust all the rest of the registers ; end of charging current curren:
           mwr     icur0,wr4       ;transfer real current number for display if
           mwr     icur1,wr3       ;in instant current mode
           mwr     icur2,wr2
           jmp     update ;
; subroutine for adjusting the current after subtraction
;
adjst1:    lds     acc,1           ;subtract 1 from register
           sub*    curr1
           bch     adjend          ;exit if done
           lds     curr1,9 adjst2:    lds     acc,1           ;subtract 1 from register
           sub*    curr2
           bch     adjend          ;exit if done
           lds     curr2,9 adjst3:    lds     acc,1           ;subtract 1 from register
           sub*    curr3
           bch     adjend          ;exit if done
           lds     curr3,9 adjst4:    lds     acc,1           ;subtract 1 from register
           sub*    curr4
           bch     adjend          ;exit if done
           lds     curr4,9 adjst5:    lds     acc,1           ;subtract 1 from register
           sub*    curr5
           bch     adjend          ;exit if done
           lds     curr5,9 adjst6:    lds     acc,1           ;subtract 1 from register
           sub*    curr6
           bch     adjend          ;exit if done call    clrcur          ;done with recharge
           lds     acc,sbit0       ;tell the outside world we are at ZERO
           or*     portb
```

```
        oiob    portb
        nop
        nop
        nop
        lds     acc,rbit0
        and*    portb
        oiob    portb adjend: rts ;
; software for converting the voltage
;
a2dvlt:
        ips     acc             ;set options
        bab1    update          ;exit out if displaying only current lds     acc,sbit1       ;flag that conversion is happening
        or*     portb
        oiob    portb sas     40H             ;turn off high output control
        call    clrwr           ;resisters for timing discharge of cap tme@V:
        addi*   wr2,1
        adci*   wr1,0
        adci*   wr0,0
        bch     cmpvlt          ;count overflow for voltage, 784 counts
                                ;near zero volts
        nop
        nop
        nop ipa*    acc
        bab0    tme@V           ;jump if not ready to start conversion sic     intoff          ;disable interrupts for testing
        sas     ,0              ;turn on high output control
wait@V: lds     wr0,0           ;resisters for checking for max voltage
        lds     wr1,0
        lds     wr2,0 pre@V:
        addi*   wr2,1
        adci*   wr1,0
        adci*   wr0,0
        bch     vltovr          ;count overflow for voltage, 4096 counts
                                ;1/4 second ipa*    acc
        bab0    wtV200          ;jump if ready to start conversion
        jmp     pre@V           ;else loop wtV200: lds     wr1,03h         ;set wr to 100 for 1st slope
        lds     wr0,06h
        jmp     wtV201 wtV202: nop                     ;delay for voltage
        nop
        nop
        nop
wtV201: nop
        nop
        nop
        nop nop                     ;delay for voltage
        nop
```

```
            nop
            nop
            nop
            subi*    wr1,1              ;sub 1 from 100 count
            sbci*    wr0,0
            bch      wtV202             ;Jump if has not generated a carry sas      40h                ;start 2nd slope, DC high on ALARM pin
            lds      wr0,0              ;clear registers
            lds      wr1,0
            jmp      cnvV0              ;jump so we have same time cnvV:       subi     wr1,5              ;delay for voltage
            sbci     wr0,0eh            ;check for more than 230 counts
            bch      cmpvlt             ;Jump if more than 230
            nop
cnvV0:
            addi*    wr1,1              ;add to count registers
            adci*    wr0,0              ;carry
            ipa*     acc                ;read port bit0
            bab0     cnvcnt             ;Jump back if still reading counts
            jmp      cmpvlt             ;Jump if state has changed cnvcnt:     nop
            nop
            nop
            nop
            addi*    wr1,1              ;add to count registers
            adci*    wr0,0              ;carry
            ipa*     acc                ;read port bit0
            bab0     cnvV               ;Jump back if still reading counts ;
; compute voltage
;
cmpvlt:
            sic      inton              ;re-enable interrupts
            sas      0                  ;turn off DC control line
            mrw      wr7,wr1             ;transfer time count to other registers
            mrw      wr6,wr0
            lds      wr5,0 addi*    wr7,8              ;add 200 to count
            adci*    wr6,0ch
            adci*    wr5,0              ;have denominator now ; changed the code below to 382.5 for Vref of 4.5 volts
; resolution would be 0.0199 volts ;multiply value by 383 (382.5 rounded) for Vref
            mwr      temp1,wr0          ;transfer to count to temp registers
            mwr      temp2,wr1 vltlp:      lds      temp3,1            ;multiply by 383
            lds      temp4,7
            lds      temp5,0fh
            call     multpy             ;multiply by 383 call     divide             ;(count * 383) / (200 + count) = volt in xx
            jmp      vltmov ;
; overfow for first slope of conversion
;
vltovr:     sas      40h                ;make control inactive
            call     clrwr4             ;set registers for 0 counts
            sic      inton              ;re-enable interrupts vltmov:
            lda      flag               ;check for first voltage reading
            bab2     notfrt             ;Jump if not the first reading
```

```
        lds     acc,sbit2       ;set bit after first reading
        or*     flag
        mwr     avlt0,wr3       ;store initial value in all registers
        sta     bvlt0
        sta     cvlt0
        sta     dvlt0
        mwr     avlt1,wr4
        sta     bvlt1
        sta     cvlt1
        sta     dvlt1
        Jmp     vltavg          ;Jump to averaging code
notfrt: lda     cvlt1           ;move out the oldest data
        sta     dvlt1
        lda     cvlt0
        sta     dvlt0 lda     bvlt1
        sta     cvlt1
        lda     bvlt0
        sta     cvlt0 lda     avlt1
        sta     bvlt1
        lda     avlt0
        sta     bvlt0 mwr     avlt1,wr4       ;newest reading
        mwr     avlt0,wr3 vltavg: call    clrwr4
        mrw     wr4,avlt1
        mrw     wr3,avlt0
        lda     bvlt1           ;start adding
        add*    wr4
        lda     bvlt0
        adc*    wr3
        adci*   wr2,0 lda     cvlt1           ;add another
        add*    wr4
        lda     cvlt0
        adc*    wr3
        adci*   wr2,0 lda     dvlt1           ;add last
        add*    wr4
        lda     dvlt0
        adc*    wr3
        adci*   wr2,0

;/*For rounding above x.5 */
        addi*   wr4,2           ;round up, will if bit1 = 1
        adci*   wr3,0
        adci*   wr2,0           ;should not overflow here lds     bacc,2
avglp:  lda     wr3             ;check for shifting a 1
        bab0    *+3
        sr0     wr4
        Jmp     *+2
        sr1     wr4 lda     wr2             ;check for shifting a 1
        bab0    *+3
        sr0     wr3
        Jmp     *+2
        sr1     wr3 sr0     wr2
        lds     acc,1
```

```
            sub*      bacc
            banz      avglp            ;loop until averaged, 2 times lds       temp1,0          ;transfer for bcd conversion
            lds       temp2,0
            mwr       temp3,wr3
            mwr       temp4,wr4

; registers for scale
            mwr       fish1,wr3        ;registers for scale
            mwr       fish2,wr4 call      hexbcd mwr       volt0,wr4        ;transfer to permanent registers
            mwr       volt1,wr3
            mwr       volt2,wr2
            Jmp       update ;*
;*  20 by 12 bit unsigned binary division
;*
;*  this routine divides the 20 bit binary number in wr0 - wr4
;*  by the 12 bit binary number in wr5 - wr7. The quotient is
;*  stored in wr0 - wr4. The remainder of the division will
;*  be stored in temp1 - temp3. temp4 & temp5 is used as a loop counter.
;*
divide:     lds       temp4,4          ;initialize the loop counter to 20
            lds       temp5,1 lds       temp1,0          ;clear temp registers
            sta       temp2
            sta       temp3 div1:       lda       wr4              ;shift left dividend and quotient (tricky)
            add*      wr4              ;as dividend is shifted left the quotient
            lda       wr3              ;is shifted left into wr4
            adc*      wr3
            lda       wr2
            adc*      wr2
            lda       wr1
            adc*      wr1
            lda       wr0
            adc*      wr0
            lda       temp3
            adc*      temp3
            lda       temp2
            adc*      temp2
            lda       temp1
            adc*      temp1 bch       div3             ;if carry, we have to do subtraction lda       wr7              ;do trial subtraction
            sub       temp3
            lda       wr6
            sbc       temp2
            lda       wr5
            sbc       temp1
            bcnh      div2             ;branch ahead if negative div3:       lda       wr7              ;do real subtraction
            sub*      temp3
            lda       wr6
            sbc*      temp2
            lda       wr5
            sbc*      temp1 addi*     wr4,1            ;add 1 to quotient
```

```
div2:   lds     acc,1           ;decrement loop counter
        sub*    temp4
        lds     acc,0
        sbc*    temp5
        or      temp4
        banz    div1            ;and loop back if not done
        rts                     ;else return ;*
;*   hex to bcd conversion
;*
;*   this routine converts a 4 nibble hex number
;*   passed to it in temp1 - temp4 to a 5 nibble
;*   bcd number stored in wr0 - wr4.
;* hexbcd: call    clrwr4          ;clear out result area
        lda     temp1
        call    convrt
        lda     temp2
        call    convrt
        lda     temp3
        call    convrt
        lda     temp4
        call    convrt
        rts                     ;return convrt: sta     acc             ;use acc ram image for temp storage
        lds     wr6,4           ;set loop counter to 4 conlop: lda     acc
        add*    acc             ;double adni    wr4,6
        adc*    wr4
        bch     con1
        adni*   wr4,10 con1:   adni    wr3,6
        adc*    wr3
        bch     con2
        adni*   wr3,10 con2:   adni    wr2,6
        adc*    wr2
        bch     con3
        adni*   wr2,10 con3:   adni    wr1,6
        adc*    wr1
        bch     con4
        adni*   wr1,10 con4:   adni    wr0,6
        adc*    wr0
        bch     con5
        adni*   wr0,10 con5:   subi*   wr6,1           ;decrement loop counter
        banz    conlop          ;loop back if not done
        rts                     ;otherwise return ;
; software for calibrating the current
;
a2doff: ips     acc             ;set options
        bab0    offend          ;exit out if displaying only voltge
        bab3    offend          ;exit out if displaying only scale
```

```
         lds     clkup,06h        ;setup for clocks to analog switches
         lds     clkdn,0ch lds     wr0,2            ;do this 2 times
offcur:  opp     four             ;flip-flop clock to converters
         opp     clkup
         nop
         nop
         nop
         nop
         nop
         nop opp     four             ;flip-flop clock to converters
         opp     clkdn
         nop
         nop
         nop
         nop
         subi*   wr0,1
         banz    offcur sf      light            ;discharge cap here
tmeoff:  opp     four             ;flip-flop clock to converters
         opp     clkup
         nop
         nop
         nop
         nop
         nop
         nop opp     four             ;flip-flop clock to converters
         opp     clkdn
         nop
         nop
         nop
         nop ipa*    acc
         bab1    tmeoff           ;jump if ready to start conversion
                                  ;else loop, ready to start conversion sic     intoff
         rf      light
preoff:  opp     four             ;flip-flop clock to converters
         opp     clkup
         nop
         nop
         nop
         nop
         ipa*    acc
         bab1    wt0200 opp     four             ;flip-flop clock to converters
         opp     clkdn
         nop
         nop
         nop ipa*    acc
         bab1    wt0200           ;jump if ready to start conversion
         jmp     preoff           ;else loop
wt0200:  lds     wr1,03h          ;set wr to 100 for 1st slope
         lds     wr0,06h          ;063h = 99 wt0202:  opp     four             ;flip-flop clock to converters
         opp     clkup
         nop
```

```
        nop
        nop
        nop
        nop
        nop opp     four            ;flip-flop clock to converters
        opp     clkdn
        nop
        nop
        nop
        subi*   wr1,1           ;sub 1 from 100 count
        sbci*   wr0,0
        bch     wt0202          ;jump if has not generated a carry sf      light           ;start 2nd slope
nv0:    opp     four            ;flip-flop clock to converters
        opp     clkup
        nop
        nop
        addi*   wr1,1           ;add to count registers
        adci*   wr0,0           ;carry
        ipa*    acc             ;read port bit0
        bab1    cntoff          ;jump on if still reading counts
        jmp     cmpoff ntoff:  opp     four            ;flip-flop clock to converters
        opp     clkdn
        nop
        nop
        addi*   wr1,1           ;add to count registers
        adci*   wr0,0           ;carry
        ipa*    acc             ;read port bit0
        bab1    cnv0            ;jump back if still reading counts ;ompute current offset off:    rf      light
        sic     inton
        lds     acc,0eh         ;resting state of the analog switches
        opp     acc mrw     wr7,wr1         ;transfer time count to other registers
        mrw     wr6,wr0
        lds     wr5,0 addi*   wr7,8           ;add 200 to count
        adci*   wr6,0ch
        adci*   wr5,0           ;have denominator now ;hanged the code below to 980 for CURRENT
;esolution would be 0.0x amperes ;ltiply value by 980
        call    clrtmp
        mwr     temp1,wr0       ;transfer to count to temp registers
        mwr     temp2,wr1 lp:     lds     temp3,3         ;load 980 into registers
        lds     temp4,0dh
        lds     temp5,4
        call    multpy          ;multiply count by 980 call    divide          ;(count * 980)/(200 + count) = current in x.xx ff:     mwr     offst0,wr4      ;transfer to permanent registers
        mwr     offst1,wr3      ;current offset
        mwr     offst2,wr2
        mwr     offst3,wr1
end:    rts                     ;return
```

```
;multiply routine
; 8 x 12 bit multiply , answer is 20 bits long
; (temp1 - temp2) x ( temp3 - temp5 ) = wr0 - wr4 mpy:    lds     bacc,8          ;8 bits to multiply
        lds     wr0,0
        lds     wr1,0
        lds     wr2,0
        lds     wr3,0
        lds     wr4,0
mltcnt: lda     temp1
        bab3    addrtn          ;add & shift mltlp:  lda     temp2           ;shift left
        add*    temp2
        lda     temp1
        adc*    temp1 lds     acc,1
        sub*    bacc
        baz     *+2             ;jump if equal 8 times
        Jmp     double
        rts addrtn: lda     temp5           ;add to answer
        add*    wr4
        lda     temp4
        adc*    wr3
        lda     temp3
        adc*    wr2
        adci*   wr1,0
        adci*   wr0,0
        Jmp     mltlp double: lda     wr4             ;shift answer to left
        add*    wr4
        lda     wr3
        adc*    wr3
        lda     wr2
        adc*    wr2
        lda     wr1
        adc*    wr1
        lda     wr0
        adc*    wr0
        Jmp     mltcnt          ;return to main multiply routine end
```

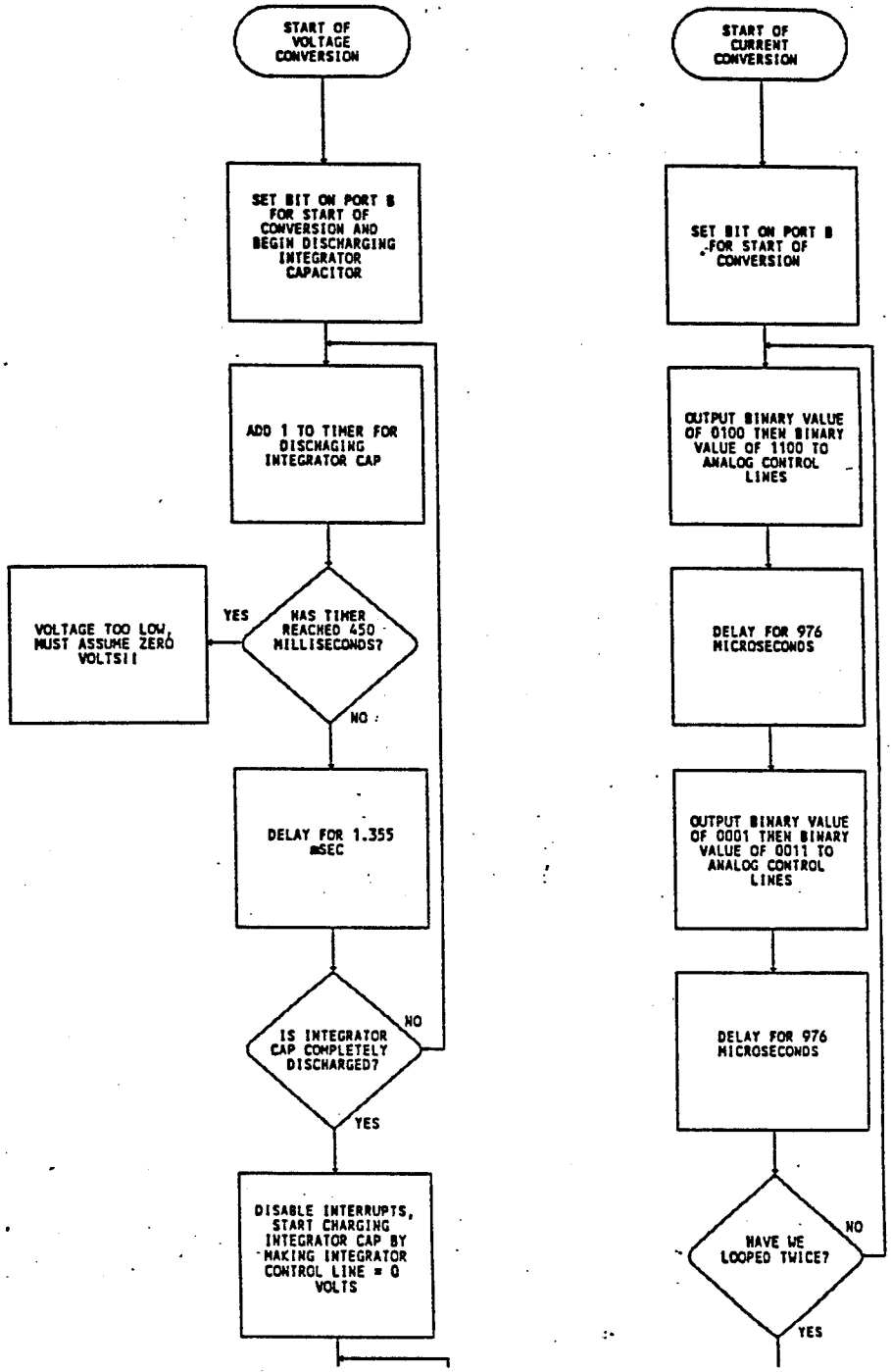

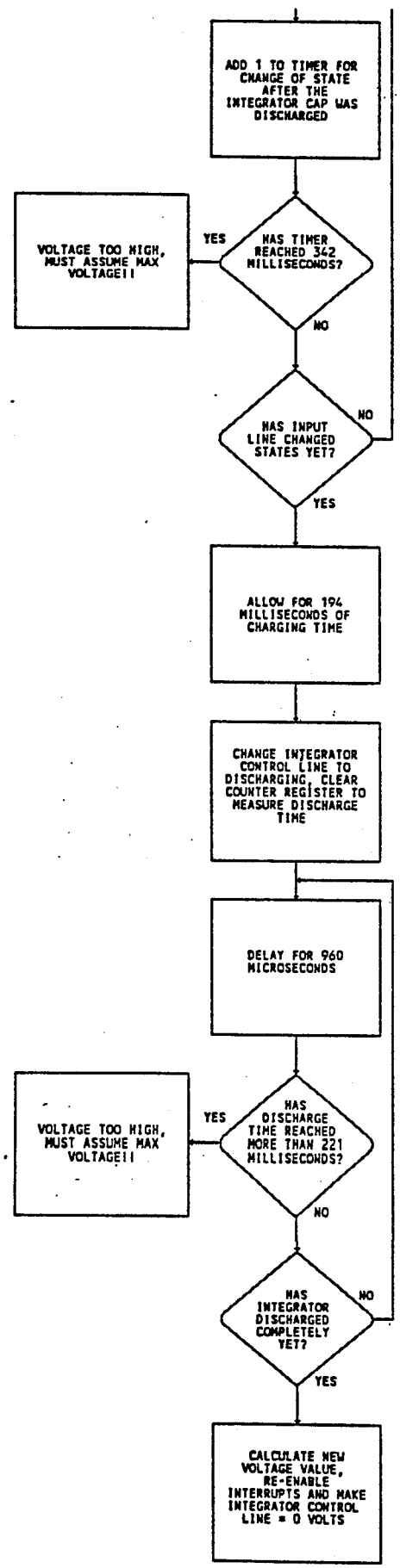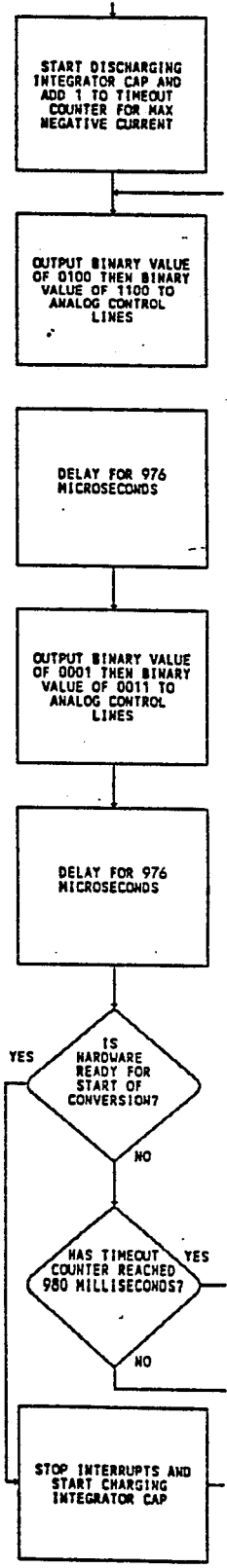

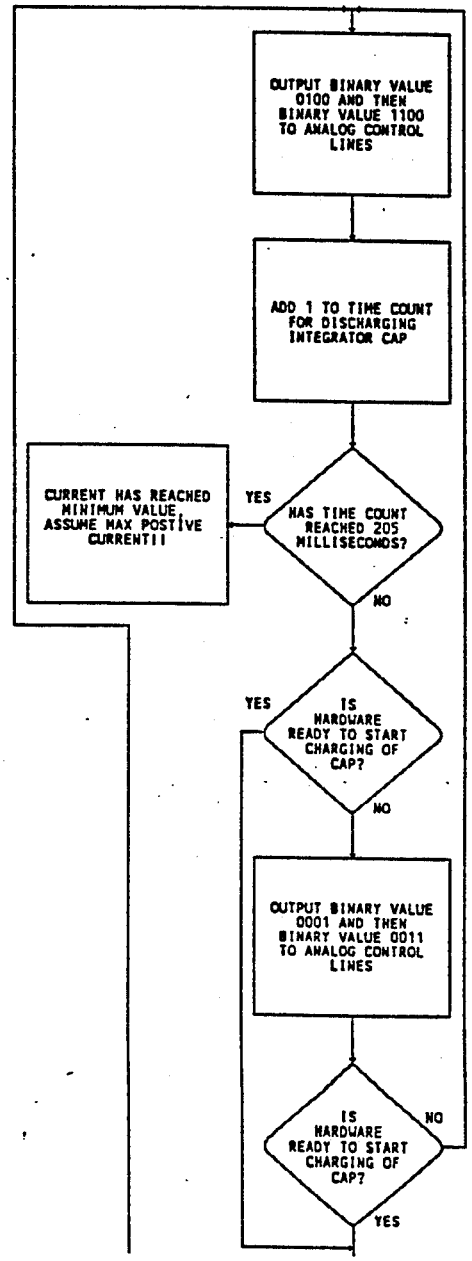

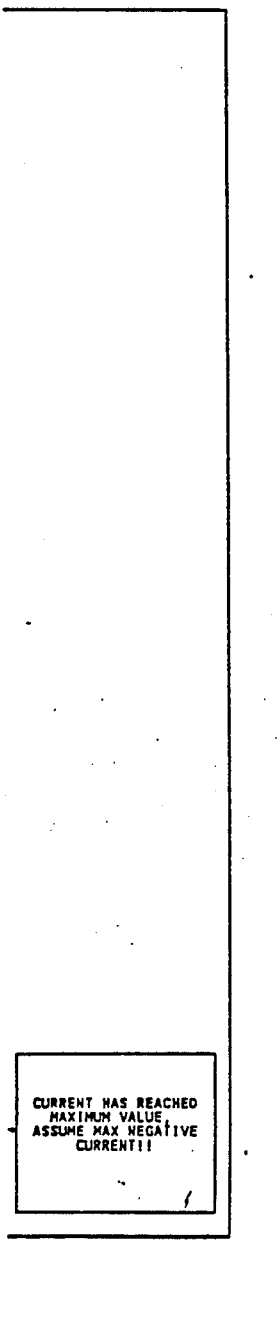
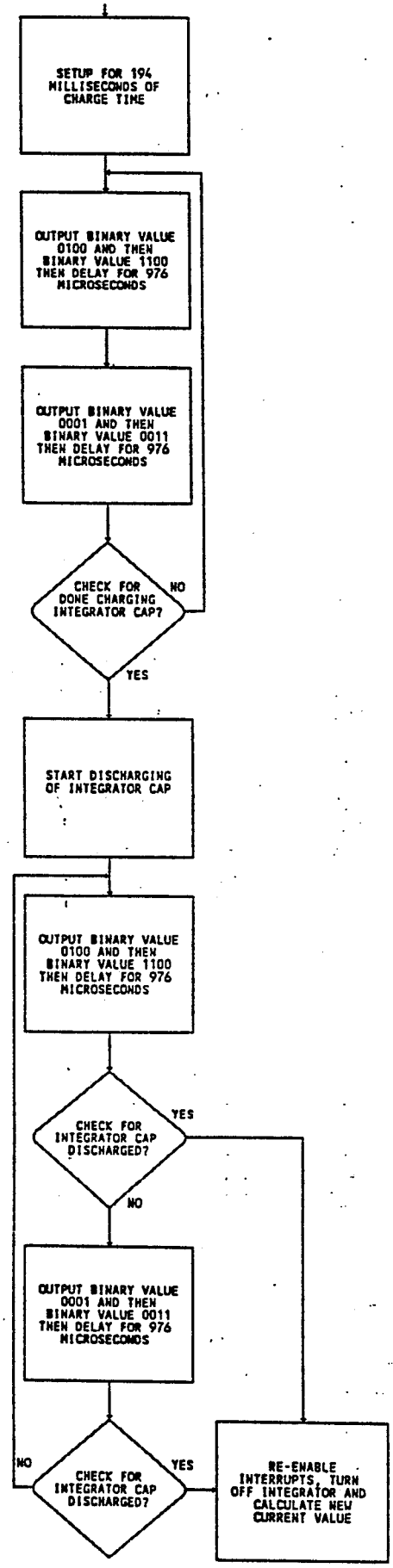

*** SEGMENT PLA ***

```
PAD NO.[38]  LCD DRIVER COM(1) NC  ..................  ..........
                       COM(2) ..  2................  ....C.....
                       COM(3) NC  ..................  ..........

PAD NO.[39]  LCD DRIVER COM(1) ..  2................  ......A.G.
                       COM(2) ..  2................  .B........
                       COM(3) NC  ..................  ..........

PAD NO.[40]  LCD DRIVER COM(1) ..  2................  A.........
                       COM(2) ..  2................  ......F...
                       COM(3) NC  ..................  ..........

PAD NO.[41]  LCD DRIVER COM(1) ..  2................  ....D.....
                       COM(2) ..  2................  .....E....
                       COM(3) NC  ..................  ..........

PAD NO.[44]  LCD DRIVER COM(1) ..  .....7..........  A.........
                       COM(2) ..  .3..............  ..C.......
                       COM(3) NC  ..................  ..........

PAD NO.[46]  LCD DRIVER COM(1) ..  .3..............  ......G...
                       COM(2) ..  .3..............  .B........
                       COM(3) NC  ..................  ..........

PAD NO.[47]  LCD DRIVER COM(1) ..  .3..............  A.........
                       COM(2) ..  .3..............  .....F....
                       COM(3) NC  ..................  ..........

PAD NO.[48]  LCD DRIVER COM(1) ..  .3..............  ...D......
                       COM(2) ..  .3..............  ....E.....
                       COM(3) NC  ..................  ..........

PAD NO.[49]  LCD DRIVER COM(1) ..  ....6...........  A.........
                       COM(2) ..  ..4.............  ...C......
                       COM(3) NC  ..................  ..........

PAD NO.[50]  LCD DRIVER COM(1) ..  ..4.............  ......G...
                       COM(2) ..  ..4.............  .B........
                       COM(3) NC  ..................  ..........

PAD NO.[51]  LCD DRIVER COM(1) ..  ..4.............  A.........
                       COM(2) ..  ..4.............  .....F....
                       COM(3) NC  ..................  ..........

PAD NO.[52]  LCD DRIVER COM(1) ..  ..4.............  ...D......
                       COM(2) ..  ..4.............  ....E.....
                       COM(3) NC  ..................  ..........

PAD NO.[53]  LCD DRIVER COM(1) ..  .....7..........  .B........
                       COM(2) ..  ...5............  ..C.......
                       COM(3) NC  ..................  ..........

PAD NO.[54]  LCD DRIVER COM(1) ..  ...5............  ......G...
                       COM(2) ..  ...5............  .B........
                       COM(3) NC  ..................  ..........
```

APPENDIX 2

```
**************  ****************************  *********
***  LC5851H SERIES OPTION INSTRUCTION VER 1.0  ***
*****************************************************
```

[ FILE NAME ]: HOPTLCD.HEX ... R/W DIR
[ COMMENT  ]:

MASK OPTION   LC5851H

-- PACKAGE/CHIP --
PACKAGE      CHIP
.......      ****

```
------------------ LCD DRIVER --------------------
STATIC     DUPLEX     1/2B-1/3D     1/3B-1/3D     UNUSED
......     *****      .........     .........     ......

---------------- LCD FREQUENCY (DEV.IN=32.78 KHz) --------------
SLOW(OSC/2048Hz)    TYP(OSC/1024Hz)    FAST(OSC/512Hz)    STOP
................   ***************    ..............     ....

------------------ INPUT S(1-4) ------------------
L-LEVEL HOLD Tr. USED     L-LEVEL HOLD Tr. UNUSED
**********************    .......................

------------------ INPUT M(1-4) ------------------
L-LEVEL HOLD Tr. USED     L-LEVEL HOLD Tr. UNUSED
**********************    .......................

---------- S,M PORT FREQ. ----------
SLOW(OSC/256Hz)    FAST(OSC/64Hz)
**************    ..............

---------- ALARM FREQ. ----------         -------- EXTERNAL RESET ------
FAST(OSC/16Hz)    SLOW(OSC/32Hz)          S1-4 ALL ON     "RES" TERMINAL
**************    ..............         ...........     **************

--.INTERNAL RESET CONTROL --
INHIBIT        NORMAL ACTION
******         ..............

---------- CYCLE TIME ----------         ---- INT INPUT RESISTOR ----
SLOW(OSC/8Hz)    FAST(OSC/4Hz)           PULL UP    PULL DOWN    OPEN
.............    **************          ******    .........    ....

-- INT SIGNAL EDGE --          ---------- TIMER CLOCK ----------
L --> H     H --> L            SLOW(OSC/512Hz)    FAST(OSC/8Hz)
.......     ******             ***************    .............

---------------- OSC OPTION ------------------
Xtal(32.768KHz)    Xtal(65.536KHz)    CERAMIC
***************    ...............    .......

PAD.NO.[55]    LCD DRIVER COM(1)  ..     ...5..........A......
                          COM(2)  ..     ...5..........F..
                          COM(3)  NC     .....................

PAD NO.[56]    LCD DRIVER COM(1)  ..     ...5.......... ...D....
                          COM(2)  ..     ...5.......... ....E...
                          COM(3)  NC     .....................

PAD NO.[57]    LCD DRIVER COM(1)  ..     ......8....... ..C.....
                          COM(2)  ..     ......8....... ..C.....
                          COM(3)  NC     .....................

PAD NO.[58]    LCD DRIVER COM(1)  ..     ......8....... ...D....
                          COM(2)  ..     ......8....... ...D....
                          COM(3)  NC     .....................

PAD NO.[59]    LCD DRIVER COM(1)  ..     ........9..... .A......
                          COM(2)  ..     ........9..... .A......
                          COM(3)  NC     .....................

PAD NO.[60]    LCD DRIVER COM(1)  ..     ........9..... .B......
                          COM(2)  ..     ........9..... .B......
                          COM(3)  NC     .....................
```

```
PAD NO.[61]   LCD DRIVER COM(1) ..        .......9.......  ..C.....
                         COM(2) ..        .......9.......  ..C.....
                         COM(3) NC        ...............  ........

PAD NO.[62]   LCD DRIVER COM(1) ..        .......9.......  ...D....
                         COM(2) ..        .......9.......  ...D....
                         COM(3) NC        ...............  ........

PAD NO.[63]   LCD DRIVER COM(1) NC        ...............  ........
                         COM(2) NC        ...............  ........
                         COM(3) NC        ...............  ........

PAD NO.[64]   LCD DRIVER COM(1) NC        ...............  ........
                         COM(2) NC        ...............  ........
                         COM(3) NC        ...............  ........

PAD NO.[65]   LCD DRIVER COM(1) NC        ...............  ........
                         COM(2) NC        ...............  ........
                         COM(3) NC        ...............  ........

BE CAREFUL NEXT SYMBOLS

*    08 , C         -    PAD NO = 57    COM1
                     -    PAD NO = 57    COM2

*    08 , D         -    PAD NO = 58    COM1
                     -    PAD NO = 58    COM2

*    09 , A         -    PAD NO = 59    COM1
                     -    PAD NO = 59    COM2

*    09 , B         -    PAD NO = 60    COM1
                     -    PAD NO = 60    COM2

*    09 , C         -    PAD NO = 61    COM1
                     -    PAD NO = 61    COM2

*    09 , D         -    PAD NO = 62    COM1
                     -    PAD NO = 62    COM2
```

Various modifications can be made to the present invention without departing from the apparent scope hereof.

We claim:

1. Apparatus for measuring the voltage on a battery comprising:
   a. a battery for storing electrical power;
   b. voltage regulator means connected to said battery having a constant reference output voltage;
   c. integrating means including a capacitor connected to said constant reference output voltage of said voltage regulator means and said battery; and,
   d. microprocessor means connected to said constant reference output voltage for initiating, charging and discharging of said capacitor, timing the charging and discharging of said capacitor, and computing battery voltage by comparing the ratios of charge time to discharge time and constant reference output voltage to battery voltage.

2. The apparatus of claim 1 further including means for displaying the battery voltage.

3. The apparent of claim 2 wherein the means for displaying is an LCD.

4. The apparatus of claim 2 wherein said means for displaying is positioned on a battery charger housing.

5. The apparatus of claim 1 wherein said charging out discharging times are dependent on said constant reference output voltage.

6. The apparatus of claim 1 wherein said battery is a NiCad battery.

7. The apparatus of claim 1 wherein said battery is an alkaline battery.

8. The apparatus of claim 1 wherein said battery is a mercury battery.

9. The apparatus of claim 1 wherein said battery is a gel battery.

10. Apparatus for measuring the current consumed by or added to a battery comprising:
    a. a battery for storing electrical power;
    b. a shunt resistor and load connected in series with said battery, said shunt resistor being of low resistance and high precision;
    c. amplification means having an output for amplifying the voltage drop across said chart resistor;
    d. integrating means connected to the output of said amplification means, said integrating means including a capacitor; and
    e. a microprocessor connected to said integration means for initiating charging of said capacitor as a function of said amplified voltage across said shunt resistor, discharging said capacitor, timing said discharge, and compacting battery current as a function of said discharge time.

11. The apparatus of claim 10 further including means for displaying battery current.

12. The apparatus of claim 11 wherein said means for displaying is an LCD.

13. The apparatus of claim 11 wherein said means for displaying is positioned on a battery charger housing.

14. The apparatus of claim 10 wherein said battery is a NiCad battery.

15. The apparatus of claim 10 wherein said battery is a mercury battery.

16. The apparatus of claim 10 wherein said battery is gel battery.

17. The apparatus of claim 10 further including calibration means for said amplification means.

18. The apparatus of claim 17 wherein said calibration means comprises analog multiplexers and an operational amplifier connected to said amplification means.

19. The apparatus of claim 18 further including multiplexers in circuit with said amplification means and said integration means.

20. The apparatus of claim 19 wherein said microprocessor controls said multiplexer so as to alternate between calibration and current sensing modes.

21. Apparatus for measuring the voltage and current of a battery comprising:
   a. a battery for storing electrical energy;
   b. voltage regulator means connected to said battery having a constant reference output voltage;
   c. integrating means including a capacitor connected to said constant reference output voltage and said battery;
   d. microprocessor means connected to said constant reference output voltage for initiating charging and discharging of said capacitor, timing, charging and discharging of said capacitor, and computing battery voltage by comparing the ratios of charge time to discharge time and constant reference output voltage to battery voltage;
   e. a shunt resistor and load connected in series with said battery, said shunt resistor being of low resistance and high precision;
   f. amplification means having an output for amplifying the voltage drop across said shunt resistance;
   g. integrating means connected to the output of said amplification means, said integration means including a capacitor; and,
   f. said microprocessor further connected to said integration means for initiating charging of said capacitor as a function of said amplified voltage across aid shunt resistor, discharging said capacitor, timing said discharge, and computing battery current as a function of said discharge time.

22. Apparatus of claim 21 further including means for displaying said voltage out current.

23. The apparatus of claim 22 wherein said means for displaying is an LCD.

24. The apparatus of claim 23 wherein said LCD display is positioned over a battery charger housing.

* * * * *